(12) United States Patent
Carroll et al.

(10) Patent No.: US 8,125,083 B2
(45) Date of Patent: Feb. 28, 2012

(54) PROTECTIVE BARRIER LAYER FOR SEMICONDUCTOR DEVICE ELECTRODES

(75) Inventors: Martin Carroll, Cardiff Wales (GB); David P. Jones, South Glamorgan (GB); Andrew N. Sawle, East Grinstead (GB); Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 164 days.

(21) Appl. No.: 11/515,652

(22) Filed: Sep. 5, 2006

(65) Prior Publication Data
US 2007/0052099 A1 Mar. 8, 2007

Related U.S. Application Data

(60) Provisional application No. 60/714,076, filed on Sep. 2, 2005.

(51) Int. Cl.
*H01L 23/52* (2006.01)
(52) U.S. Cl. ... 257/751; 257/330; 257/738; 257/E23.02; 257/E23.51; 438/614
(58) Field of Classification Search ............... 257/330, 257/738, 751, E23.02, E23.51; 438/614
See application file for complete search history.

(56) References Cited

U.S. PATENT DOCUMENTS 6,028,011 A 2/2000 Takase et al.
(Continued)

FOREIGN PATENT DOCUMENTS

JP 2003-124249 4/2003

OTHER PUBLICATIONS

International Search Report issued Jul. 3, 2008 in corresponding PCT Application No. PCT/US06/34448.

*Primary Examiner* — Cuong Q Nguyen
*Assistant Examiner* — Cathy N Lam
(74) *Attorney, Agent, or Firm* — Farjami & Farjami LLP

(57) ABSTRACT

A semiconductor device includes a die with at least one electrode on a surface thereof, at least one solderable contact formed on the electrode, and a passivation layer formed over the electrode and including an opening that exposes the solderable contact. The passivation layer opening may be wider than the solderable contact such that a gap extends between the contact and the passivation layer. The device also includes a barrier layer disposed on the top surface of the electrode, and along the underside of the solderable contact and across the gap. The barrier layer may also extend under the passivation layer and may cover the entire top surface of the electrode. The barrier layer may also extend along the sidewalls of the electrode. The barrier layer may include a titanium layer or a titanium layer and nickel layer. The barrier layer protects the electrode and underlying die from acidic fluxes found in lead-free solders.

13 Claims, 30 Drawing Sheets

U.S. PATENT DOCUMENTS

| | | |
|---|---|---|
| 6,649,533 B1 | 11/2003 | Iacoponi |
| 2005/0074959 A1 | 4/2005 | Burrell et al. |
| 2005/0208751 A1* | 9/2005 | Oh et al. ................ 438/614 |
| 2006/0027861 A1* | 2/2006 | Nakazawa ................ 257/330 |
| 2008/0044997 A1* | 2/2008 | Takewaki et al. ............ 438/614 |

* cited by examiner

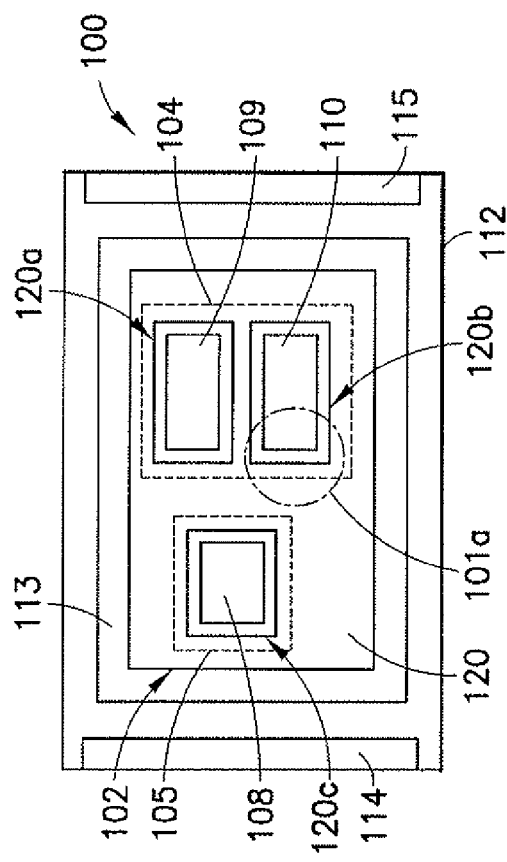
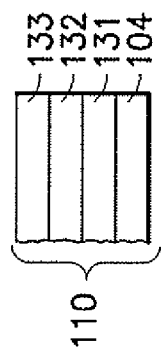
FIG. 2A
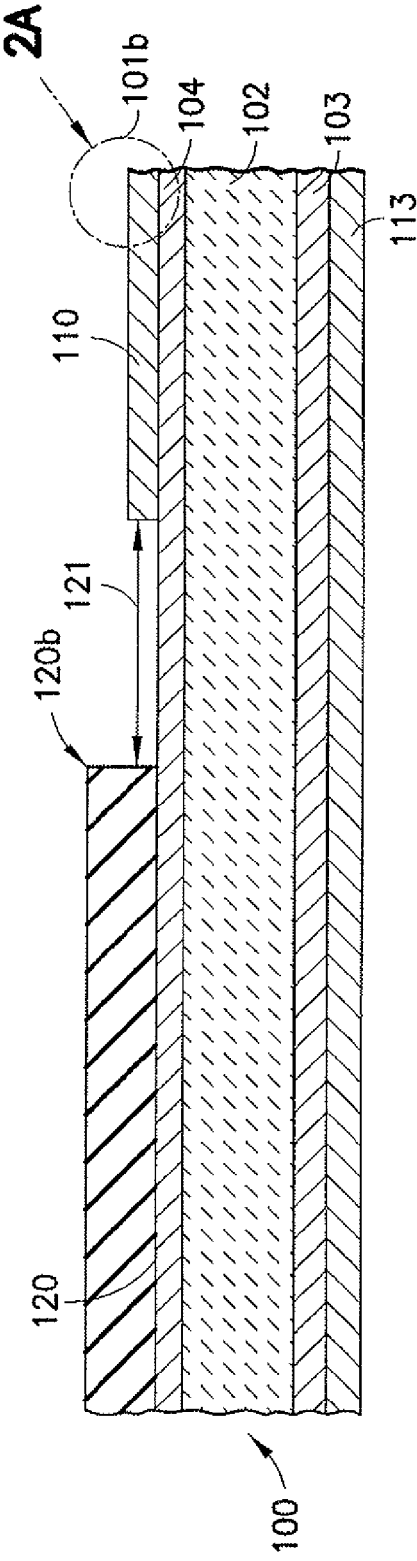
FIG. 1 PRIOR ART
FIG. 2 PRIOR ART

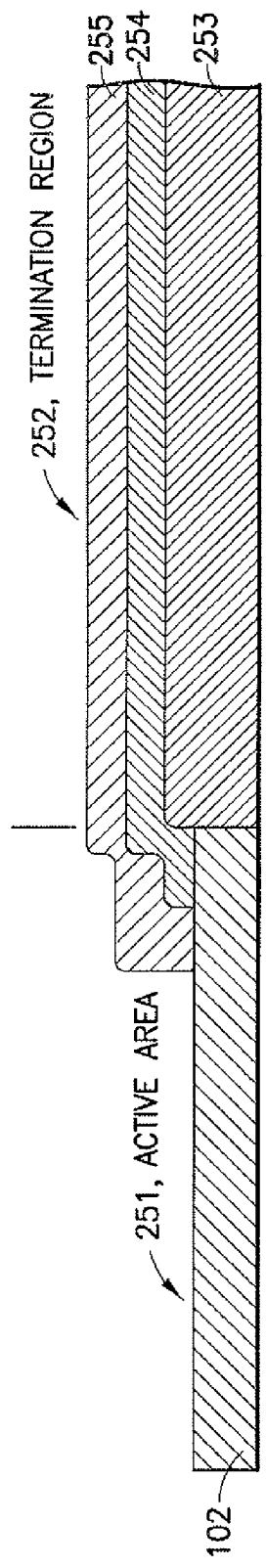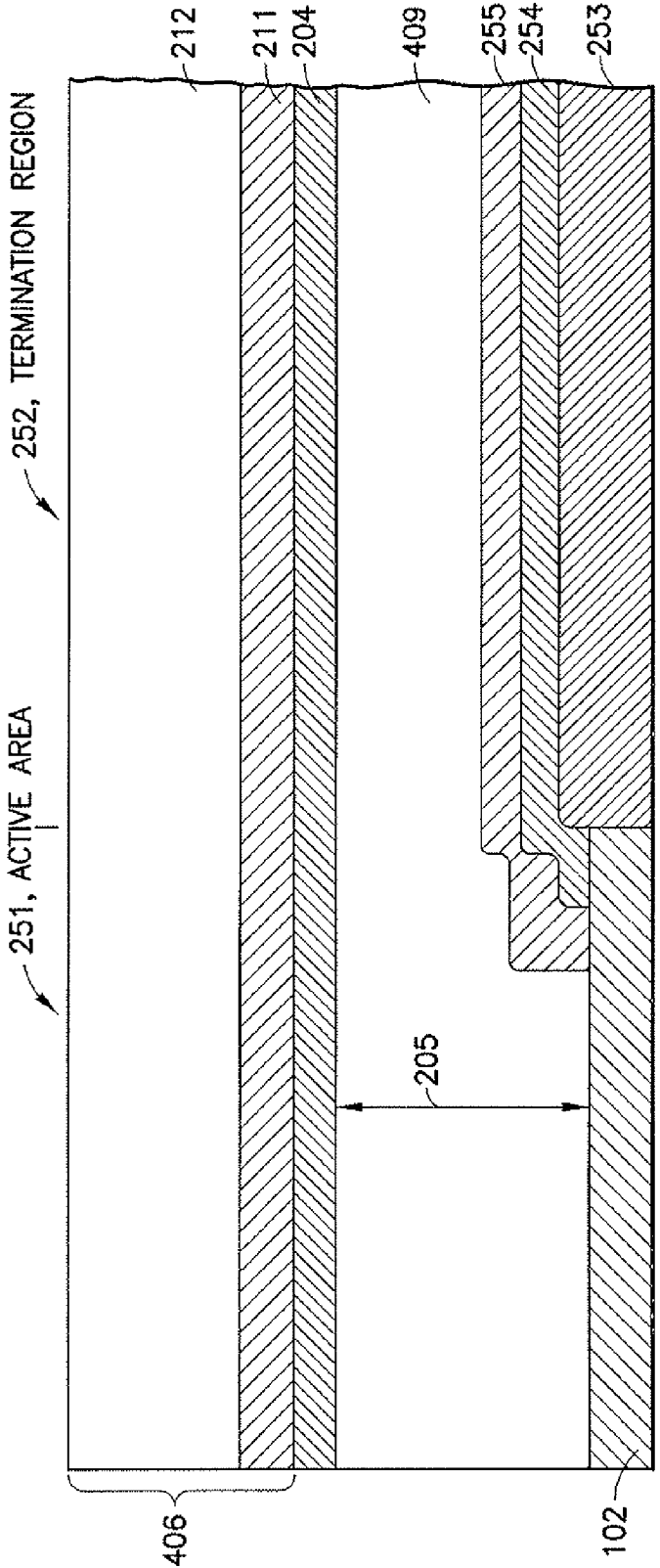

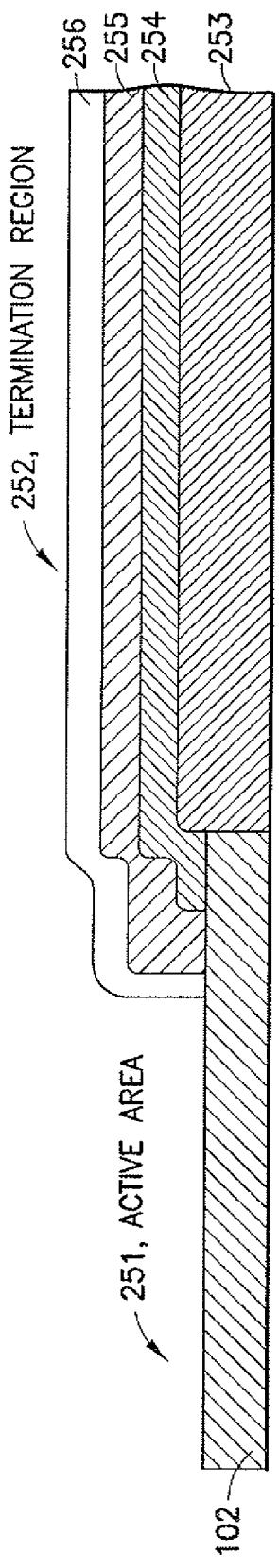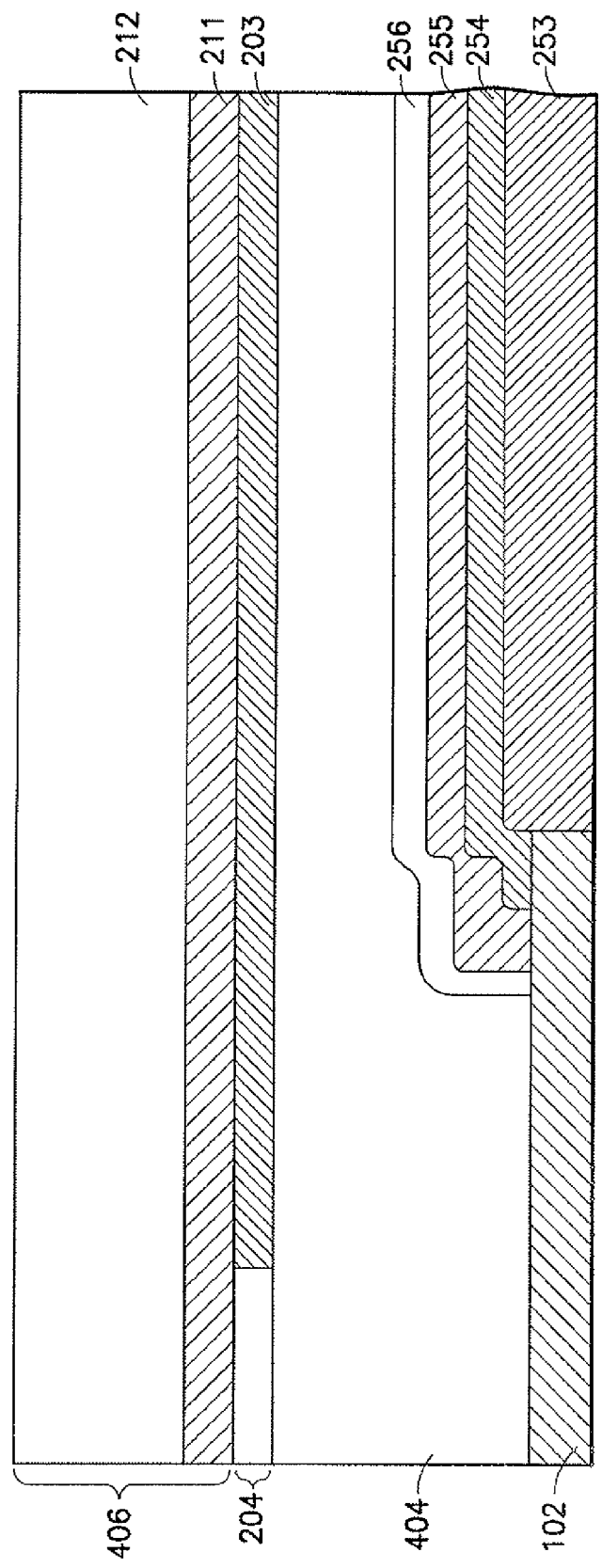

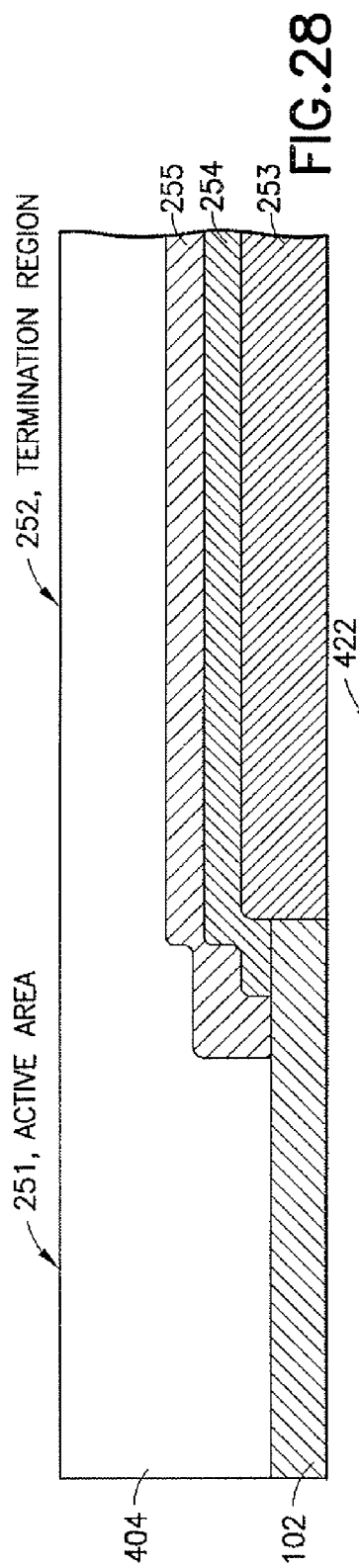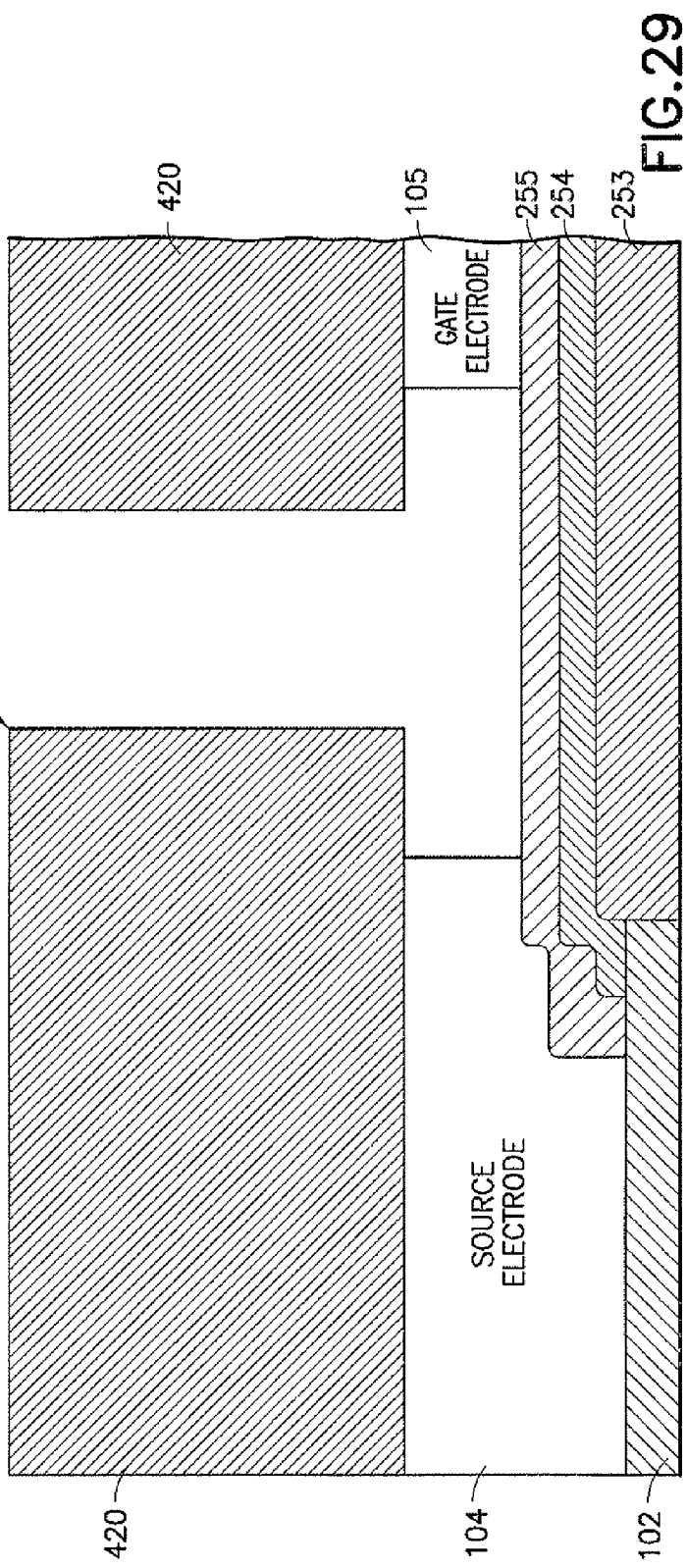

PROTECTIVE BARRIER LAYER FOR SEMICONDUCTOR DEVICE ELECTRODES

RELATED APPLICATION

This application is based on and claims benefit of U.S. Provisional Application No. 60/714,076, filed on Sep. 2, 2005, entitled "Solderable Top Metallization and Passivation for Semiconductor Package," by Martin Carroll et al., to which a claim of priority is hereby made and the disclosure of which is incorporated by reference.

BACKGROUND OF THE INVENTION

1. Field of the Invention

This invention relates generally to semiconductor devices and more specifically, relates to barrier layers for device electrodes that protect the electrodes from active components in lead-free solders.

2. Description of the Prior Art

Devices such as DirectFET® type devices (see U.S. Pat. No. 6,624,522) and flip-chip type devices have one or more metallized electrodes made of aluminum for example, formed on a first surface of a semiconductor die. These electrodes are configured to be soldered directly to conductive pads on a support substrate, such as a printed circuit board, for example. Still other devices may have one or more metallized electrodes that are configured such that when the device is packaged, the electrodes are soldered either directly or indirectly to the package leads.

For example, referring to FIG. 1 and FIG. 2 there is shown a bottom view of an example DirectFET® type device package 100 (of the type disclosed in the aforementioned patent) and a cross-sectional side view of a portion of this device package as shown by circle 101a of FIG. 1. Device package 100 includes a cup-shaped or can-shaped conductive clip 112 that has an open bottom (shown in FIG. 1), a top web 113, and two flanges 114 and 115 that are electrically connected to web 113. Housed within clip 112 is a power MOSFET semiconductor die 102. Die 102 includes a drain electrode 103 on a bottom surface thereof and a source electrode 104 and a gate electrode 105 on a top surface thereof (the source and gate electrodes are represented by the dotted lines in FIG. 1). Drain electrode 103 is in electrical contact with web 113 and thereby with flanges 114 and 115. Source electrode 104 and gate electrode 105 are exposed by the open bottom of conductive clip 112 and are intended to be soldered directly to the pads of a substrate, for example.

In order to facilitate the soldering of the source and gate electrodes to the substrate pads, solderable contacts 109 and 110 are formed atop source electrode 104 and solderable contact 108 is formed atop gate electrode 105. Solderable contacts 108, 109, and 110 are typically made of a silver containing solderable metal such as a tri-metal stack of titanium 131, nickel 132, and silver 133 as shown in FIG. 2A, which is an expanded cross-sectional side view of a portion of solderable contact 110 as shown by circle 101b. A passivation layer 120 formed of epoxy for example and acting as a solder resist for example, is disposed over the top surface of die 102 and along the top surfaces of source electrode 104 and gate electrode 105. Openings 120a, 120b, and 120c are formed in passivation layer 120 over the source and gate electrodes, thereby exposing each of the solderable contacts on these electrodes.

In the past, passivation layer 120 and solderable contacts 108-110 have been formed such that the solderable contacts and passivation layer abut/overlap. However, this abutting/overlapping configuration has created device reliability issues. Specifically, it has been found that under prolonged exposure to electric fields and moisture, silver ions from the solderable contacts may migrate and form dendrites. Notably, when solder is applied to the surfaces of these contacts in order to attach the electrodes of the die to the pads of a substrate, the solder will typically dissolve the exposed silver along the contact surfaces, thereby forming a solder alloy that captures the silver and prevents the formation of dendrites. However, when the passivation layer and solderable contacts are formed in an abutting/overlapping relationship, the passivation layer conceals portions of the outer surfaces of the solderable contacts, thereby preventing the silver along these surfaces from being reached during soldering as a described above. As a result, the silver along these surfaces is not dissolved by the solder and may be a source of migrating ions, which may migrate over the passivation layer and form dendrites, reducing device reliability.

To overcome this problem, openings 120a-120c in the passivation layer may be configured to be wider than the solderable contacts 108-110, as shown in FIGS. 1 and 2. As a result, the solderable contacts 108-110 are spaced from passivation layer 120 by surrounding gaps, such as gap 121, which gaps expose the metallized electrodes thereunder, as shown in FIG. 2. With this configuration, the entire top and side surfaces of the solderable contacts 108-110 are exposed, thereby allowing the solder to cover these surfaces and dissolve the exposed silver, limiting the formation of dendrites.

Notably, however, this gapped configuration of the passivation layer and solderable contacts causes other problems. Specifically, the solders commonly used in the past to connect the solderable contacts 108-110 to the pads of a substrate were lead-containing solders. However, lead-free solders are now in use and are being developed to avoid the environmental hazards of lead. A key lead-free solder is a tin/silver/copper alloy known as "SAC". The SAC alloys melt at a higher temperature than lead eutectic based solders used in conventional board assemblies to date. Notably, the SAC alloys contain fluxes that activate the surfaces of the solderable contacts. In particular, these fluxes may contain several acids, such as acids within the carboxylic acid group. During the solder activation stage, oxides present on the surfaces of the solderable contacts are etched by these acids to create clean surfaces onto which the solder can alloy.

Notably, during this solder activation stage, the fluxes within the solder may extend into the gaps, such as gap 121, that extend between the solderable contacts and passivation layer 120 and may contact the exposed aluminum electrodes thereunder. It has been found that the acids within these fluxes adversely react with the aluminum electrodes, causing holes to form through the electrodes. As a result, the acidic fluxes are able to attack the active semiconductor junctions and gates under the electrodes, thereby affecting the reliability of the device.

Referring to FIG. 3, there is shown an alternative cross-sectional side view of the circled portion 101a of the device package of FIG. 1. Here, a protective passivation layer 135 made of nitride or an acrylic acetate for example, has been deposited along the top surfaces of the source and gate electrodes in order to protect the electrodes and the active junctions and gates thereunder from acidic fluxes. In particular, passivation layer 135 has been deposited under passivation layer 120 and along the gaps between the solderable contacts and passivation layer 120. However, it has been found that the formation of protective layer 135 is expensive and also affects the quality of the resulting device.

SUMMARY OF THE INVENTION

Accordingly, it is desirable to provide a protective barrier layer for the electrodes of a semiconductor device that protects the electrodes, and thereby the active semiconductor junctions thereunder, from the acidic fluxes found in lead-free solders and that overcomes the above and other disadvantage of the prior art. According to a preferred embodiment of the invention, a semiconductor device, such as a vertical conduction power MOSFET packaged as a DirectFET® type device package, includes a die with a source electrode and a gate electrode disposed along a top surface thereof. The device also includes at least one solderable contact on the source electrode and at least one solderable contact on the gate electrode. The device further includes a passivation layer disposed on the top surface of the die and over the source and gate electrodes. The passivation layer has openings formed therein that expose each of the solderable contacts on the source and gate electrodes. In a preferred embodiment of the invention, each opening in the passivation layer is wider than its corresponding solderable contact. As a result, a gap is formed between confronting edges/sides of each solderable contact and the surrounding passivation layer, which gap surrounds the solderable contact and extends along the full height of the solderable contact.

According to the present invention, the device also includes barrier layers that cover at least a portion of the top surfaces of the source and gate electrodes. Specifically, according to an embodiment of the invention, the barrier layers extend between the underside of the solderable contacts and the top surfaces of the source and gate electrodes and also extend along the gaps between the solderable contacts and the passivation layer and in particular, may extend up to at least the confronting edges of the passivation layer. In a preferred embodiment of the invention, the barrier layers may also extend beyond the gaps that surround the solderable contacts and under the passivation layer. In particular, according to an embodiment of the invention, the barrier layers may extend across the top surfaces of the source and gate electrodes, under the passivation layer, and towards the outer peripheral edges of the electrodes. According to an embodiment of the invention, the barrier layers may be recessed back from the outer peripheral edges of the electrodes, leaving outer peripheral portions along the top surfaces of these electrodes exposed. According to another embodiment of the invention, the barrier layers may extend across the entire top surfaces of the source and gate electrodes up to the outer peripheral edges of the electrodes, thereby covering the entire top surfaces of these electrodes. According to a further embodiment of the invention, the barrier layers may also extend beyond the outer peripheral edges of the source and gate electrodes, thereby overhanging the electrodes. According to a still further embodiment of the invention, the barrier layers may extend across the entire top surfaces of the source and gate electrodes and may also extend along the vertical sidewalls that surround the outer peripheral edges of these electrodes.

According to the present invention, the barrier layers are a conductive material and in particular, are a material that is able to withstand the acidic nature of the fluxes found in lead-free solders. According to an embodiment of the invention, the barrier layers are made of a layer of titanium. As indicated, the solderable contacts formed on the source and gate electrodes are formed atop the barrier layers. When the barrier layers are made of a layer of titanium, each solderable contact may be a silver containing solderable metal stack such as a nickel layer and a silver layer, although other conventional stacks known in the art may be used. According to another embodiment of the invention, the barrier layers include a layer of titanium disposed atop the source and gate electrodes and also include a layer of nickel for example, disposed atop the titanium layer. Here, the solderable contacts formed on the source and gate electrodes are formed atop the nickel layer and may include only a layer of silver.

According to the present invention, by forming barrier layers along the top surfaces of the source and gate electrodes at least along the gaps that surround the solderable contacts, the barrier layers protect the electrodes from the acidic fluxes of the lead-free solders that may extend into the gaps as the device is soldered to the pads of a substrate, for example. In particular, the barrier layers prevent the acidic fluxes from contacting the electrodes along these gaps, thereby preventing the fluxes from forming holes through the electrodes and attacking the active semiconductor junctions and gates thereunder. In addition, by also extending the barrier layers beyond the gaps and under the passivation layer and possibly along the entire top surfaces and sidewalls of the electrodes, the barrier layers further protect the electrodes and active semiconductor junctions and gates thereunder from any fluxes or active components present within the fluxes that may penetrate underneath the passivation layer.

In addition to DirectFET® type device packages, one skilled in the art will recognize that the barrier layers of the present invention are also applicable to other semiconductor devices that have electrodes that are intended to be soldered to conductive pads on a support substrate or otherwise soldered to external conductors. For example, the present invention is also applicable to flip-chip devices, bumped/wafer level packages, and to devices that are packaged such that the device electrodes are soldered to the package leads either directly or through clips/straps, for example. In addition, one skilled in the art will also recognize that the present invention is applicable to devices other than power MOSFETs, such as diodes.

According to an embodiment of the invention, in order to fabricate a device, such as a DirectFET® type device package, that has barrier layers formed along the top surfaces of the source and gate electrodes, a contact metal layer is first deposited over the top surface of a semiconductor die along the active area and termination region thereof. Thereafter, a titanium layer is deposited over the surface of the contact metal layer and a layer of nickel and a layer of silver for example, are then deposited over the top surface of the titanium layer.

Thereafter, a first mask is formed over the silver layer. If the barrier layer is to include only a layer of titanium, portions of the silver layer and nickel layer are then etched to expose the titanium layer, thereby forming at least one solderable contact of silver and nickel for each of the source and gate electrodes. Next, a second mask is formed over the exposed surface of the titanium layer and portions of the titanium layer are then etched to expose the underlying contact metal layer, thereby forming a titanium barrier layer for each of the source and gate electrodes. Alternatively, if the barrier layer is to include both a layer of nickel and a layer of titanium, the first mask is used to only etch portions of the silver layer, thereby exposing the nickel layer and forming solderable contacts of silver for each of the source and gate electrodes. Thereafter, the second mask is formed over the nickel layer and portions of the nickel layer and titanium layer are then etched to expose the underlying contact metal layer, thereby forming a nickel-titanium barrier layer for each of the source and gate electrodes.

Thereafter, the exposed contact metal layer is etched down to the surface of the termination region. As a result, source and gate electrodes are formed that each have a titanium (or nickel-titanium) barrier layer along a top surface thereof and that further have at least one solderable contact of silver and nickel (or just silver) along the top surface of the respective barrier layer.

According to an embodiment of the invention, as a result of etching the contact metal layer to form the source and gate electrodes, the contact metal layer may be etched from the underside of the outer peripheral edges of the barrier layers such that the barrier layers overhang the outer peripheral edges of the electrodes. According to an embodiment of the invention, these overhangs may be left in place. Alternatively, according to another embodiment of the invention, the barrier layers may be further etched to remove these overhangs, for example.

To complete the device, a passivation layer is next formed over the top surface of the die, covering the solderable contacts and barrier layers. Thereafter, using any suitable process, openings are formed in the passivation layer to expose each solderable contact.

According to another embodiment of the invention, the above described process is modified to protect the termination region, which may be damaged during the above process. According to this embodiment of the invention, prior to depositing the contact metal layer over the top surface of the die, a barrier layer made of titanium for example, is first deposited along the termination region. The process then proceeds as above, depositing the contact metal layer atop the die, depositing the titanium layer atop the contact metal layer, etc., and eventually etching the titanium layer (or the titanium and nickel layers) to form barrier layers. Thereafter, the contact metal layer is etched down to the top surface of the barrier layer along the termination region, thereby forming the source and gate electrodes. Once the electrodes are formed, the barrier layer along the termination region is removed and in particular, is etched to expose a portion of the top surface of the termination region. Thereafter, the fabrication process again proceeds as above.

According to another embodiment of the invention, in order to fabricate a device that has a barrier layer formed along the top and side surfaces of the source and gate electrodes, a contact metal layer is first deposited over the top surface of the semiconductor die along the active area and termination region. Thereafter, a mask is formed over the contact metal layer and portions of this layer are etched down to the top surface of the termination region, thereby forming source and gate electrodes. A titanium layer is then deposited over the entire top and side surfaces of the source and gate electrodes and along the exposed top surface of the termination region. A layer of nickel and a layer of silver for example, are then deposited over the top surface of the titanium layer.

Thereafter, a mask is formed over the silver layer. Assuming the barrier layer is to include only a layer of titanium, portions of the silver layer and nickel layer are then etched to expose the titanium layer, thereby forming at least one solderable contact of silver and nickel for each of the source and gate electrodes. Next, a mask is formed over the exposed surfaces of the titanium layer and portions of the titanium layer are then etched only along the termination region. As a result, a titanium barrier layer is formed over the entire top and side surfaces of each of the source and gate electrodes. Again, the above process may be altered such that the barrier layers atop the source and gate electrodes are nickel-titanium barrier layers and such that the solderable contacts include only a layer of silver.

Next, a passivation layer is formed over the top surface of the die, covering the solderable contacts and barrier layers. Thereafter, openings are formed in the passivation layer to expose each solderable contact.

Other features and advantages of the present invention will become apparent from the following description of the invention which refers to the accompanying drawings.

BRIEF DESCRIPTION OF THE DRAWINGS

FIG. 1 is a bottom view of an example DirectFET® device package of the type shown in U.S. Pat. No. 6,624,522.

FIG. 2 shows an example cross-sectional side view of the circled portion of FIG. 1 and in particular, shows an example configuration of an electrode, a corresponding solderable contact, and a passivation layer according to the prior art.

FIG. 2a shows an example cross-sectional side view of the circled portion of FIG. 2 and in particular, shows an example solderable contact according to the prior art.

FIGS. 8-17 illustrate an example process according to an embodiment of the invention for fabricating the semiconductor devices of FIGS. 4 and 5.

FIGS. 18-23 illustrate an alternative example process according to an embodiment of the invention for fabricating a device similar to the device of FIG. 4.

FIGS. 28-34 illustrate an example process according to an embodiment of the invention for fabricating the semiconductor device of FIG. 7.

DETAILED DESCRIPTION OF THE PREFERRED EMBODIMENTS

Figure 3:
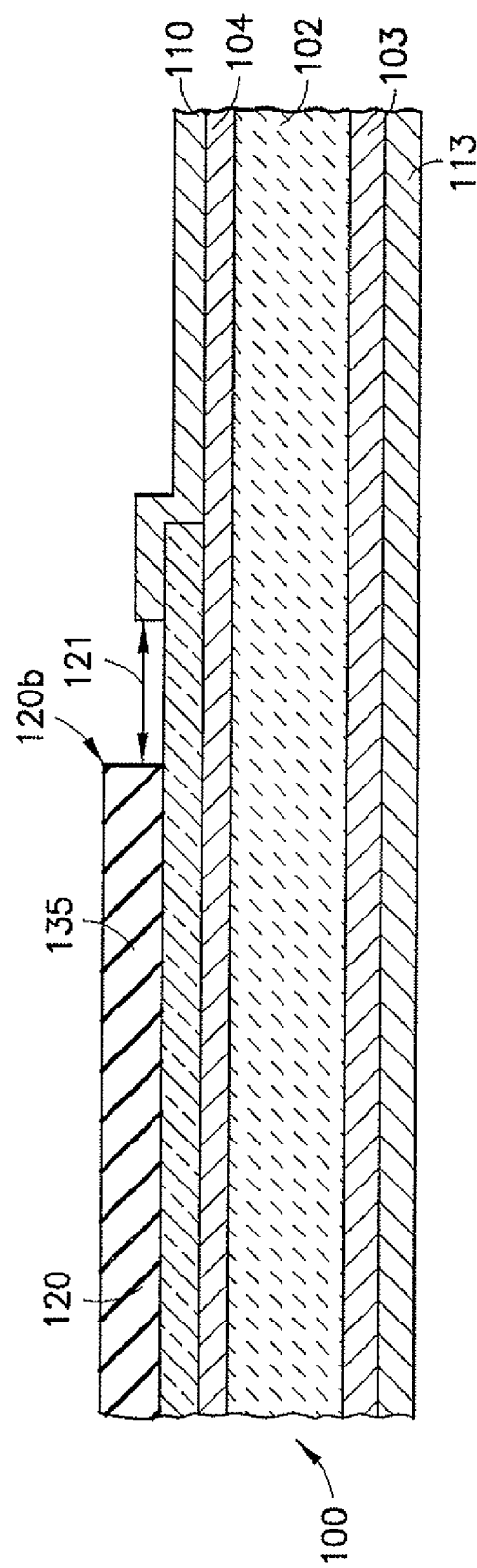
FIG. 3 shows another example cross-sectional side view of the circled portion of FIG. 1 and in particular, shows a protective passivation layer formed along a portion of the top surface of the electrode according to the prior art.
Figure 4:
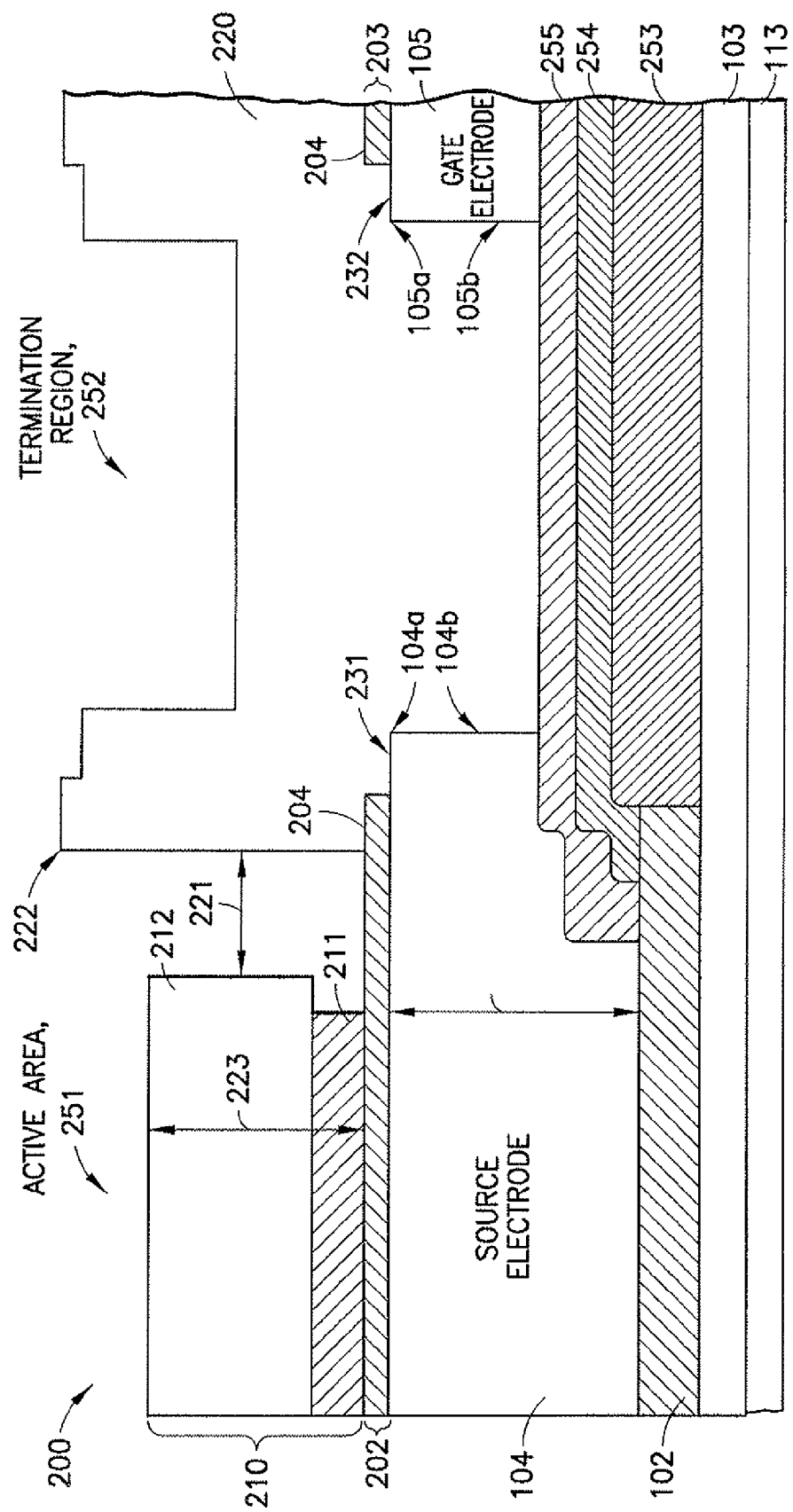
FIG. 4 shows a cross-sectional side view of a portion of an example semiconductor device according to an embodiment of the invention, the device including barrier layers formed across a portion of the top surfaces of the device electrodes, which barrier layers protect the device electrodes from acid fluxes found in lead-free solders.

Referring to FIG. 4, there is shown a cross-sectional side view of a portion of an example semiconductor device 200 according to a preferred embodiment of the invention (note that FIG. 4 is not drawn to scale). As an example, device 200 is a vertical conduction power MOSFET packaged as a DirectFET® type device package as similarly described in U.S. Pat. No. 6,624,522. Device 200 includes a semiconductor die 102 made of silicon, silicon-carbide (SiC), Gallium Nitride (GaN), or the like. Die 102 has junctions formed therein (not shown in FIG. 4) configured as a vertical conduction power MOSFET. Surrounding the outer periphery of active area 251 of die 102 is termination region 252. This termination region may include a field oxide ring 253, a field plate 254 formed of polysilicon for example that extends from active area 251 over field oxide ring 253, and an inter level dielectric (ILD) layer 255 disposed over field plate 254.

Device 200 also includes a drain electrode 103 on a bottom surface of die 102, which electrode is in electrical contact with web 113 of the conductive clip of the DirectFET® package. Drain electrode 103 may be formed of aluminum although some other metallization may be used. Device 200 further includes a source electrode 104 and a gate electrode 105 on a top surface of die 102, each electrode being formed of aluminum although again, some other metallization may be used. The source electrode may have a thickness 205 of about 4 um along the active area 251. At least one solderable contact, such as contact 210, is formed on source electrode 104 and at least one solderable contact (not shown in the Figure) is formed on gate electrode 105 (note that the solderable contact(s) on the gate electrode resemble solderable contact 210). Each solderable contact may be a silver-containing solderable metal.

Device 200 also includes a passivation layer 220 with a thickness of about 18 um for example, disposed on the top surface of die 102 and over source electrode 104 and gate electrode 105. Passivation layer 220 may be any suitable epoxy passivation that may also be able to act as a solder resist. Passivation layer 220 has openings formed therein that expose each of the solderable contacts on source electrode 104 and gate electrode 105. In a preferred embodiment of the present invention, each opening in the passivation layer is wider than the corresponding solderable contact. As a result, a gap is formed between confronting edges/sides of each solderable contact and the surrounding passivation layer, which gap surrounds the solderable contact and extends along the full height of the solderable contact. As indicated above, spacing the solderable contacts and passivation layer 220 in this fashion prevents the passivation layer from concealing any of the surfaces of the solderable contacts. As a result, when solder is applied to the contacts and reflowed, the solder is able to cover the entire outer surfaces of the solderable contacts and dissolve the exposed silver along these surfaces, thereby limiting the formation of dendrites. In a preferred embodiment of the present invention, passivation layer 220 is also thicker than the solderable contacts. As a result, the solderable contacts do not extend beyond the top surface of passivation layer 220.

As an example, referring to solderable contact 210 on source electrode 104, passivation layer 220 has an opening 222 formed therein, which opening exposes the solderable contact. As described above, solderable contact 210 is disposed at the bottom of opening 221 and does not extend above the top surface of passivation layer 220. In addition, opening 221 is wider than solderable contact 210. As a result, a gap 221 is formed between confronting edges/sides of solderable contact 210 and passivation layer 220, which gap surrounds solderable contact 210 and extends along the full height 223 of the contact. Gap 221 may have a width of about 15 um. Again, each of the solderable contacts of device 200 preferably has a form that resembles solderable contact 210.

Figure 5:
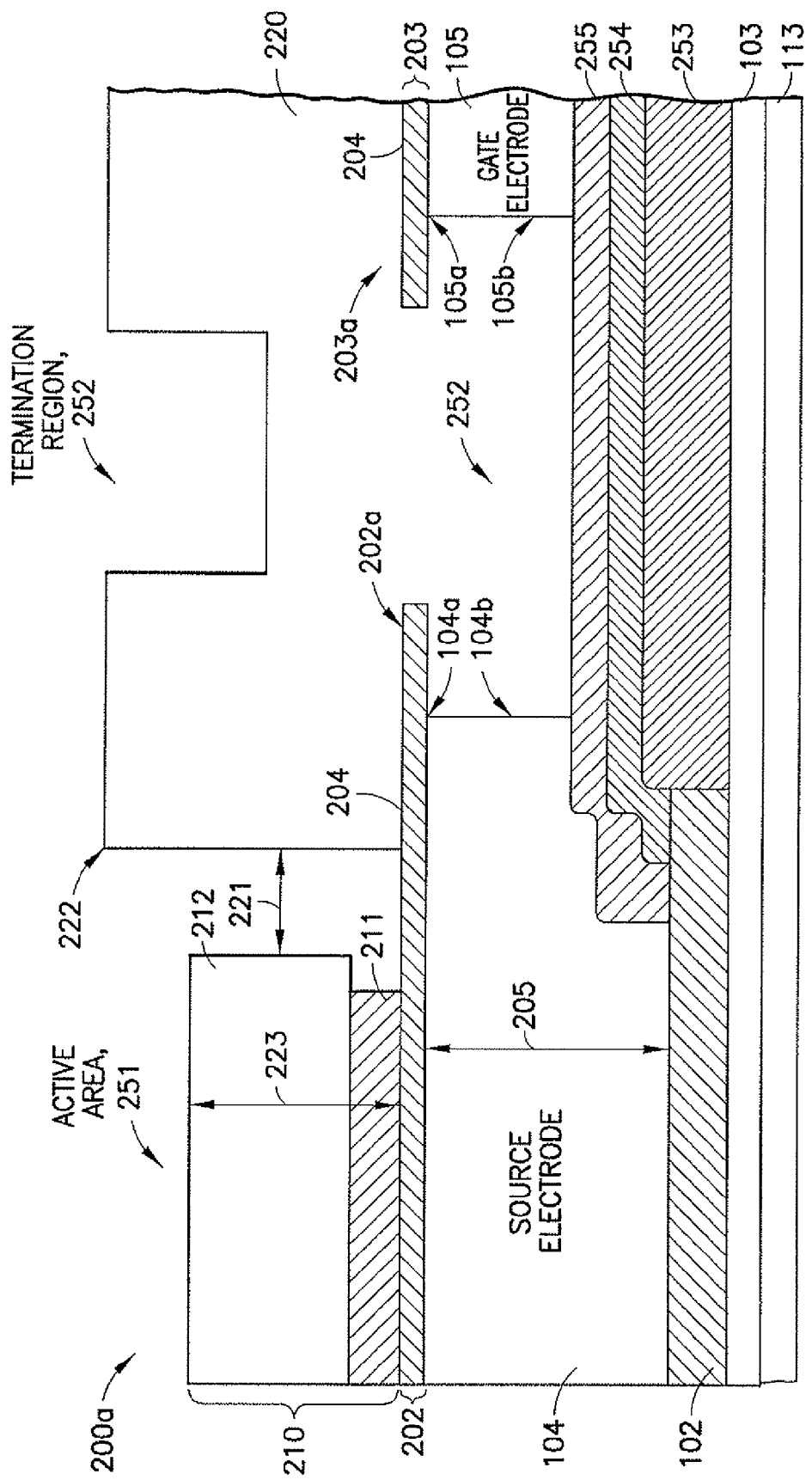
FIG. 5 shows a cross-sectional side view of a portion of an example semiconductor device according to another embodiment of the invention, the device including protective barrier layers formed across the entire top surfaces of the device electrodes.

According to the present invention, device 200 also includes barrier layers 202 and 203 that cover at least a portion of the top surfaces of source electrode 104 and gate electrode 105, respectively. Specifically, according to an embodiment of the invention, barrier layers 202 and 203 extend between the underside of the solderable contacts and the top surfaces of the electrodes and along the gaps between the solderable contacts and passivation layer 220 and in particular, extend up to at least the confronting edges of passivation layer 220. For example, referring to solderable contact 210, barrier layer 202 extends along the underside of this contact and along gap 221 up to the confronting edge of opening 222 of passivation layer 220. In a preferred embodiment of the present invention and as shown in FIG. 4, barrier layers 202 and 203 may also extend beyond the gaps that surround the solderable contacts and under passivation layer 220. In particular, according to an embodiment of the invention, the barrier layers 202 and 203 may extend across the top surfaces of the source and gate electrodes, under passivation layer 220, and towards the outer peripheral edges 104a and 105a of the electrodes. According to an embodiment of the invention and as shown in FIG. 4, the barrier layers may be recessed back from the outer peripheral edges 104a and 105a of the electrodes, leaving outer peripheral portions 231 and 232 along the top surfaces of these electrodes exposed. According to another embodiment of the invention, the barrier layers 202 and 203 may extend across the entire top surfaces of the source and gate electrodes up to the outer peripheral edges 104a and 105a of the electrodes, thereby covering the entire top surfaces of these electrodes. According to a further embodiment of the invention and as shown by device 200a in FIG. 5 (note that FIG. 5 is not drawn to scale), the barrier layers 202 and 203 may also extend beyond the outer peripheral edges 104a and 105a of the source and gate electrodes, thereby forming overhangs 202a and 203a.

According to the present invention, barrier layers 202 and 203 are a conductive material and in particular, are a material that is able to withstand the acidic nature of the fluxes found in lead-free solders, such as SAC. According to an embodiment of the invention, barrier layers 202 and 203 are made of a layer of titanium 204 that has a thickness of about 1800 Å, for example. As indicated above, the solderable contacts formed on the source and gate electrodes, such as solderable contact 210, are formed atop the barrier layers 202 and 203. When the barrier layers are made of a layer of titanium 204, each solderable contact may be a silver containing solderable metal stack such as a nickel layer 211 and a silver layer 212, although other conventional stacks known in the art may be used. Nickel layer 211 may have a thickness of about 2000 Å and silver layer 212 may have a thickness of about 6000 Å.

Significantly, by forming barrier layers 202 and 203 along the top surfaces of the source and gate electrodes at least along the gaps that surround the solderable contacts, the barrier layers protect the electrodes from the acidic fluxes of the lead-free solders that may extend into the gaps as device 200 is soldered to the pads of a substrate, for example. In particular, the barrier layers prevent the acidic fluxes from contacting the electrodes along these gaps, thereby preventing the fluxes from forming holes through the electrodes and attacking the active semiconductor junctions and gates thereunder. In addition, by also extending barrier layers 202 and 203 beyond the gaps and under passivation layer 220, the barrier layers further protect the electrodes and active semiconductor junctions and gates thereunder from any flux or active components present within the flux that may penetrate underneath the passivation layer.

Figure 6:
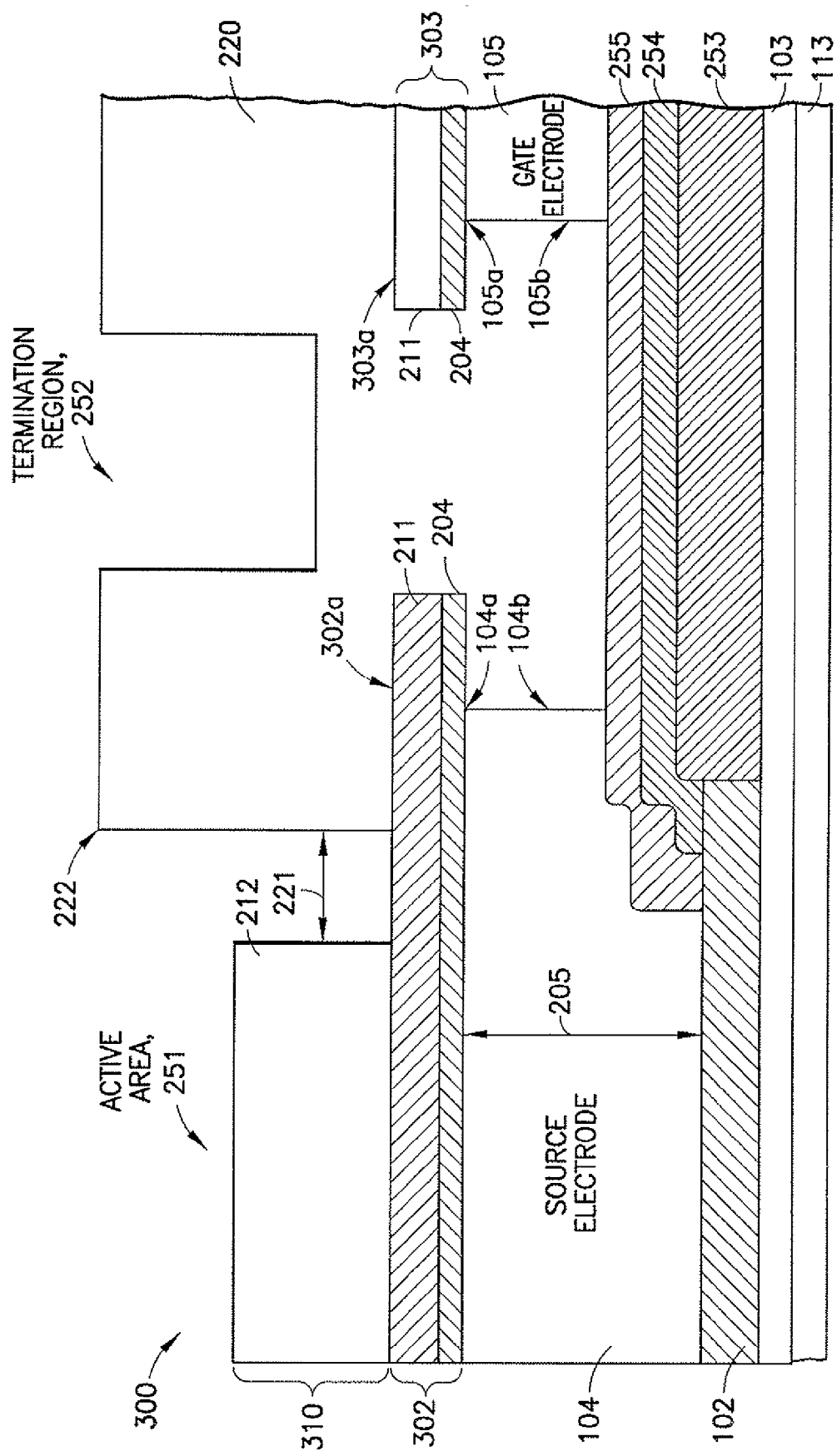
FIG. 6 shows a cross-sectional side view of a portion of an example semiconductor device according to another embodiment of the invention, the device including alternative protective barrier layers formed across the entire top surfaces of the device electrodes.

Referring now to FIG. 6, in which like numerals identify like elements, there is shown a cross-sectional side view of a portion of an example semiconductor device 300 according to another embodiment of the invention (note that FIG. 6 is not drawn to scale). Device 300 is similar to device 200 and includes at least one solderable contact, such as contact 310, formed on source electrode 104 and at least one solderable contact (not shown in the Figure) formed on gate electrode 105. As similarly described above, each solderable contact is preferably spaced from passivation layer 220 by a surrounding gap, such as gap 221 that surrounds solderable contact 310. Device 300 also includes barrier layers 302 and 303, which layers are similar to barrier layers 202 and 203 and cover at least a portion of the top surfaces of source electrode 104 and gate electrode 105, respectively. According to this embodiment of the invention, however, barrier layers 302 and 303 now include a layer of titanium 204 disposed atop the source and gate electrodes and also include a layer of nickel 211 for example, disposed atop the titanium layer. Titanium layer 204 may have a thickness of about 1800 Å and nickel layer 211 may have a thickness of about 2000 Å. Similar to above, the solderable contacts formed on the source and gate electrodes, such as solderable contact 310, are formed atop the barrier layers and in particular, are now disposed atop nickel layer 211. When barrier layers 302 and 303 include a layer of titanium and nickel, each solderable contact may include only a silver layer 212 with a thickness of about 6000 Å, for example.

Similar to barrier layers 202 and 203, barrier layers 302 and 303 extend over the top surfaces of their respective electrodes and in particular, may extend at least along the underside of the solderable contacts and along the gaps between these solderable contacts and the surrounding passivation layer 220. Preferably, barrier layers 302 and 303 also extend under passivation layer 220. In particular, according to an embodiment of the invention, barrier layers 302 and 303 may extend across the top surfaces of the source and gate electrodes, under passivation layer 220, and towards the outer peripheral edges 104a and 105a of the electrodes. As similarly described above, the barrier layers may be recessed back from the outer peripheral edges 104a and 105a of the source and gate electrodes (similar to FIG. 4), may extend up to the outer peripheral edges 104a and 105a of the electrodes, or may extend beyond the outer peripheral edges 104a and 105a of the electrodes, thereby forming overhangs 302a and 303a, as shown in FIG. 6.

Figure 7:
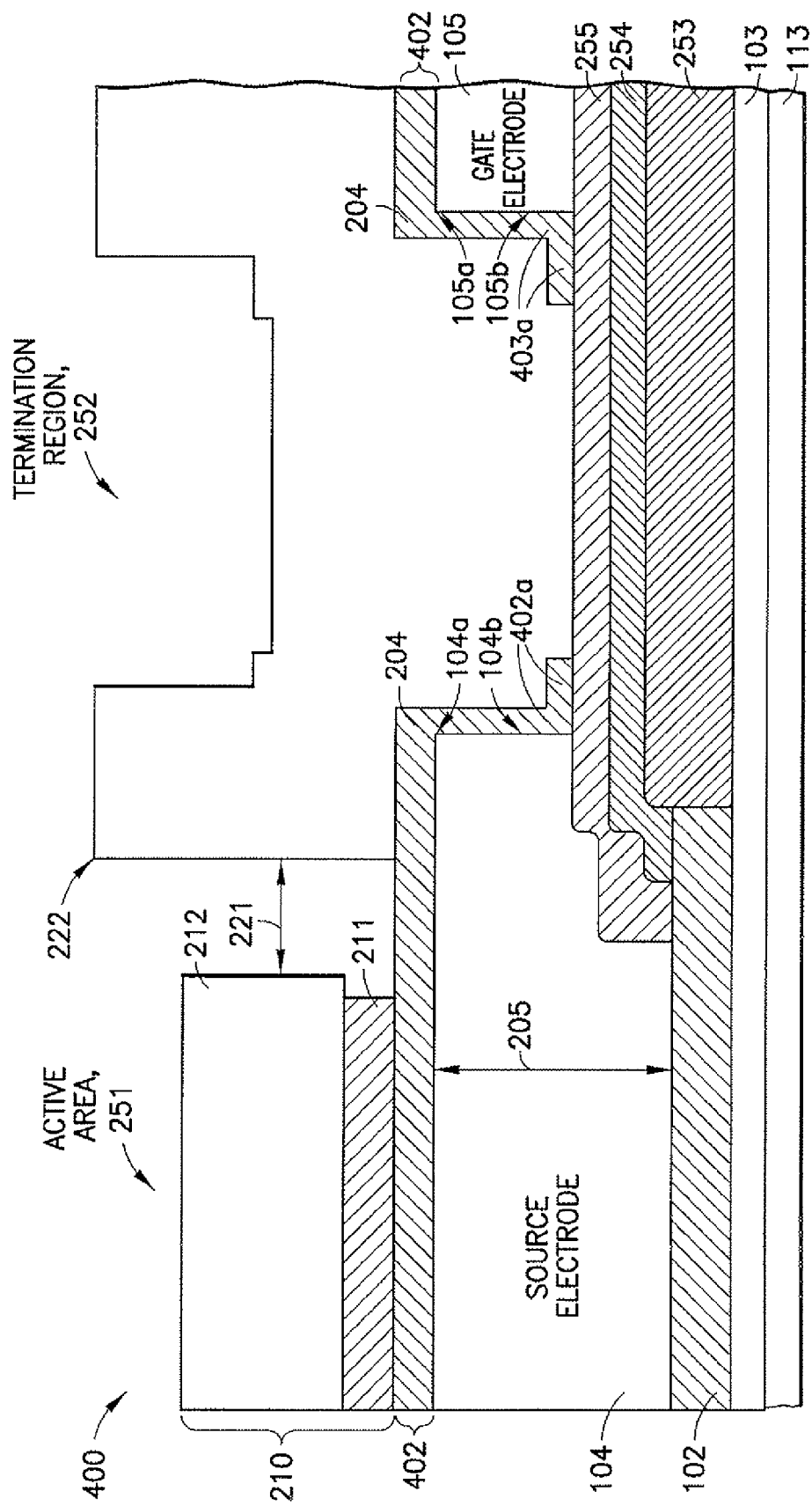
FIG. 7 shows a cross-sectional side view of a portion of an example semiconductor device according to a further embodiment of the invention, the device including protective barrier layers formed across the entire top and side surfaces of the device electrodes.

Referring now to FIG. 7, in which like numerals identify like elements, there is shown a cross-sectional side view of a portion of an example semiconductor device 400 according to another embodiment of the invention (note that FIG. 7 is not drawn to scale). Device 400 is similar to device 200 and includes barrier layers 402 and 403 that are similar to barrier layers 202 and 203, respectively. According to this embodiment of the invention, however, barrier layers 402 and 403 now cover the entire top and side surfaces of these electrodes. Specifically, barrier layers 402 and 403 extend across the entire top surfaces of the source and gate electrodes and also include extensions 402a and 403a that extend along the vertical sidewalls 104b and 105b that surround the outer peripheral edges 104a and 105a of these electrodes. As shown in FIG. 7, extensions 402a and 403a may also extend along ILD layer 255. By further extending barrier layers 402 and 403 along the sidewalls of the source and gate electrodes, the electrodes and active semiconductor junctions and gates thereunder are further protected from any flux or active components present within the flux that may penetrate underneath passivation layer 220. In addition, this configuration may qualify the device to an industrial qualification level.

According to this embodiment of the invention and as shown in FIG. 7, barrier layers 402 and 403 may include a layer of titanium 204 that has a thickness of about 1800 Å, for example. Here, the solderable contacts, such as contact 210, may be a silver containing solderable metal stack such as a nickel layer 211 and a silver layer 212, although other conventional stacks known in the art may be used. Nickel layer 211 may have a thickness of about 2000 Å and silver layer 212 may have a thickness of about 6000 Å. According to another embodiment of the invention, barrier layers 402 and 403 may include a layer of titanium atop the source and gate electrodes and a layer of nickel for example, atop the titanium layer, similar to device 300. Again, the titanium layer may have a thickness of about 1800 Å and the nickel layer may have a thickness of about 2000 Å. Here, the solderable contacts may include only a silver layer that has a thickness of about 6000 Å, for example.

One skilled in the are will recognize that while the present invention is illustrated in FIGS. 4-7 as applied to a Direct-FET® type device package, the barrier layers of the present invention are applicable to any semiconductor device with electrodes that are intended to be soldered to conductive pads on a support substrate or otherwise soldered to external conductors. For example, the present invention is also applicable to flip-chip devices, bumped/wafer level packages, and devices packaged such that the device electrodes are soldered to the package leads either directly or through clips/straps, for example. In addition, one skilled in the art will also recognize that the present invention is applicable to devices other than power MOSFETs, such as diodes.

Referring now to FIGS. 8-17, there is shown an example process according to an embodiment of the invention for manufacturing semiconductor devices 200 and 200a as shown in FIGS. 4 and 5, for example. One skilled in the art will recognize that a plurality of devices 200/200a may be simultaneously formed from a single wafer, which devices are eventually singulated to form individual devices 200/200a. For description purposes, the fabrication of a single device 200/200a will be described. Beginning with FIG. 8, a vertical conduction type power MOSFET is first formed in any known manner in a silicon wafer, thereby resulting in die 102. A termination region 252 may also be formed around the outer periphery of active area 251 of die 102 in any known manner. As indicated, termination region 252 may include a field oxide ring 253, a field plate 254, and an ILD layer 255.

Referring to FIG. 9, a contact metal layer 404, such as aluminum, is next deposited over the top surface of die 102 along active area 251 and termination region 252 and thereafter sintered. Contact metal layer 404 may be deposited to have a thickness 205 of about 4 um along the active area. Once depositing contact metal layer 404, a barrier layer is next deposited over the entire top surface, for example, of the contact metal layer. According to this embodiment of the invention, the barrier layer may be a layer of titanium 204 deposited to a thickness of about 1800 Å, for example. Thereafter, a solderable top metal 406 is deposited over the top surface of titanium layer 204. Again, this solderable top metal may be a silver-containing metal stack, such as a layer of nickel 211 and a layer of silver 212, each deposited to a thickness of about 2000 Å and 6000 Å, respectively.

Figure 10:
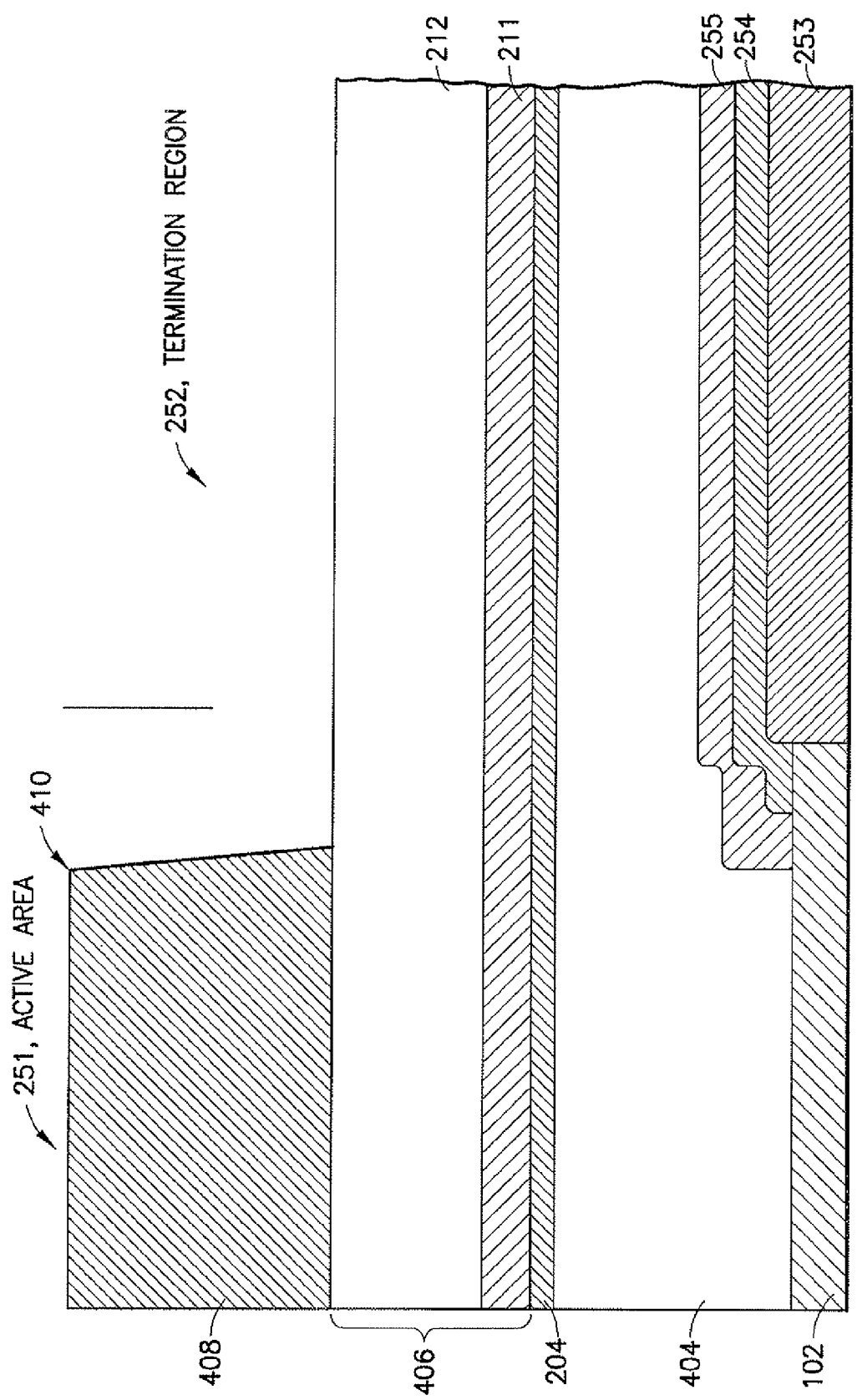

Referring to FIG. 10, a suitable photoresist layer 408 is next formed atop solderable top metal 406. As further described below, this photoresist layer is used as a mask to form at least one solderable contact, such as contact 210, over source electrode 104 and at least one solderable contact over gate electrode 105. Accordingly, photoresist layer 408 is next patterned by an appropriate photolithographic mask step based on the desired number and pattern of solderable contacts. Thereafter and as shown in FIG. 10, a plurality of openings, such as opening 410, are then formed through the photoresist layer, thereby exposing a portion of the top surface of solderable top metal 406.

Figure 11:
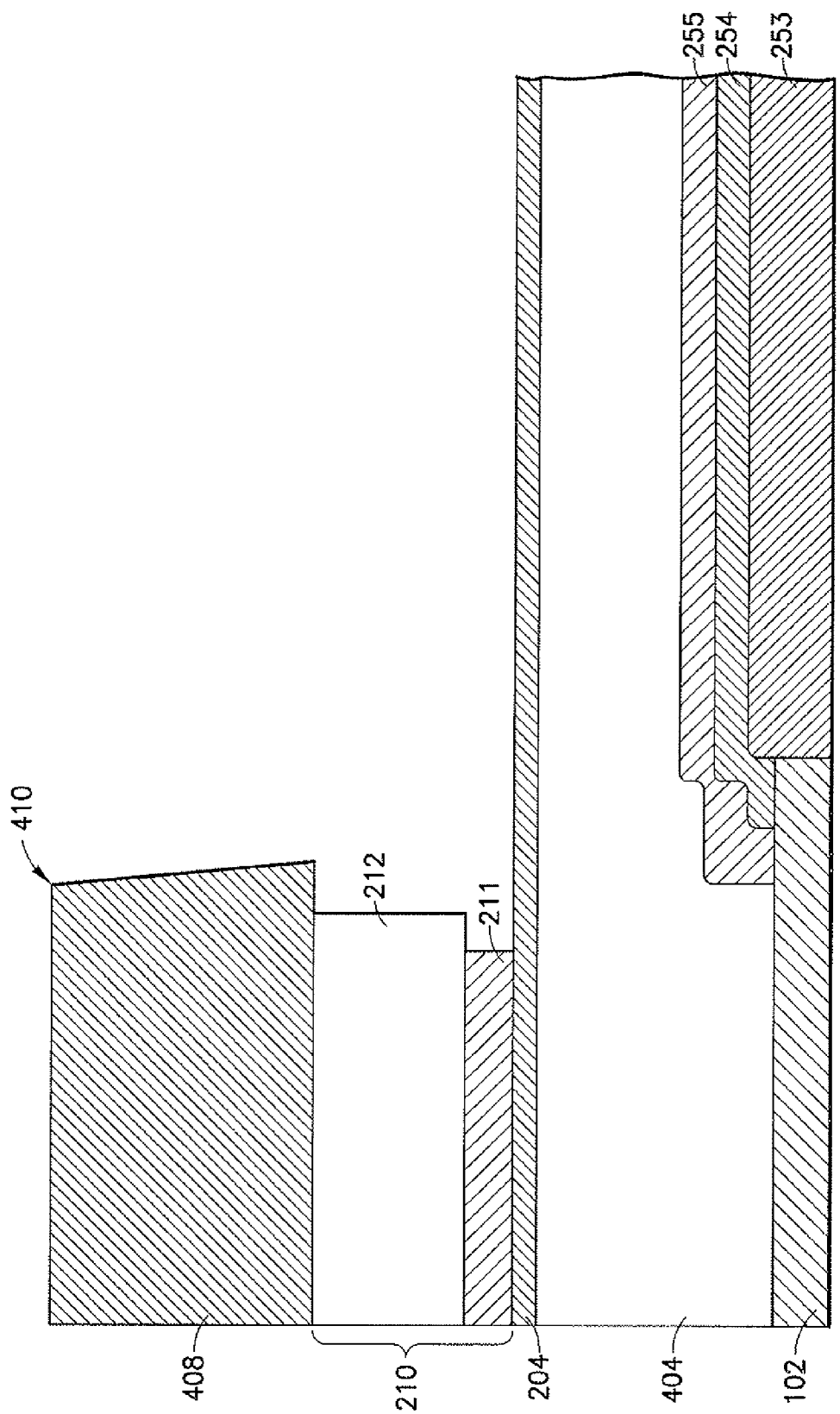

Referring to FIG. 11, photoresist layer 408 is then used as a mask to etch silver layer 212 and nickel layer 211 from the top surface of titanium layer 204, thereby forming solderable contacts, such as contact 210, for the source and gate electrodes. As an example, silver layer 212 may be etched by first immersing the device of FIG. 10 into a tank containing a mixture of ammonium hydroxide (NH4OH) and hydrogen peroxide at room temperature for about one minute and thereafter rinsing the device. Similarly, nickel layer 211 may next be etched by immersing the device into a tank of nitric acid (HNO3) for about nine minutes and thereafter rinsing the device.

Figure 12:
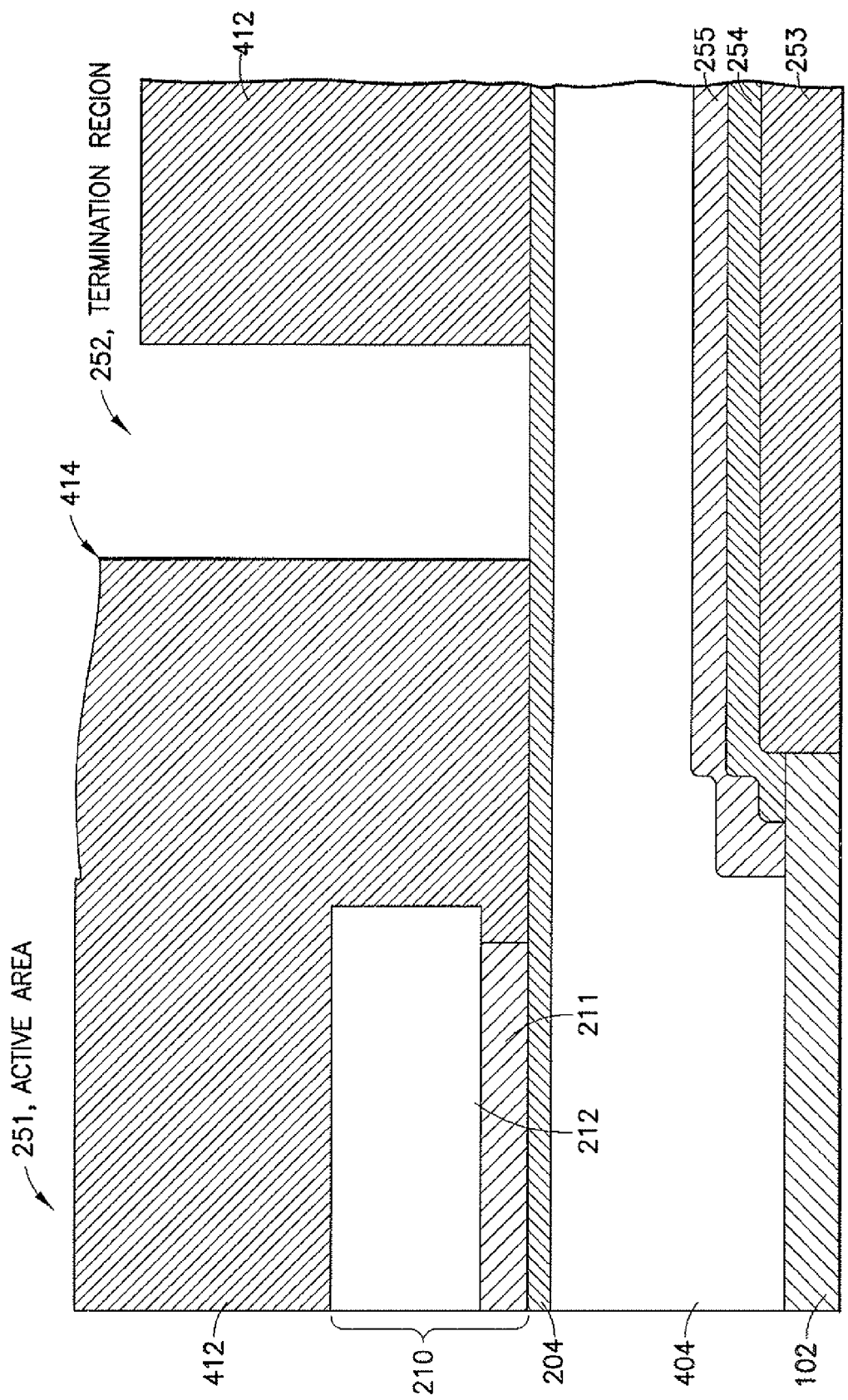

Referring to FIG. 12, photoresist layer 408 may next be removed from the surfaces of the resulting solderable contacts and a second suitable photoresist layer 412 then formed over the solderable contacts and atop the exposed surface of titanium layer 204. Alternatively, photoresist layer 408 may be left in place and photoresist layer 412 formed along the exposed surface of titanium layer 204, for example. As further described below, photoresist layer 412 is used as a mask to form source electrode 104 and gate electrode 105 and is also used to form barrier layers 202 and 203 atop these electrodes. Accordingly, photoresist layer 412 is next patterned by an appropriate photolithographic mask step based on the desired pattern of the electrodes/barrier layers. Thereafter and as shown in FIG. 12, a plurality of openings, such as opening 414, are then formed through photoresist layer 412 along the termination region, thereby exposing a portion of the top surface of titanium layer 204.

Figure 13:
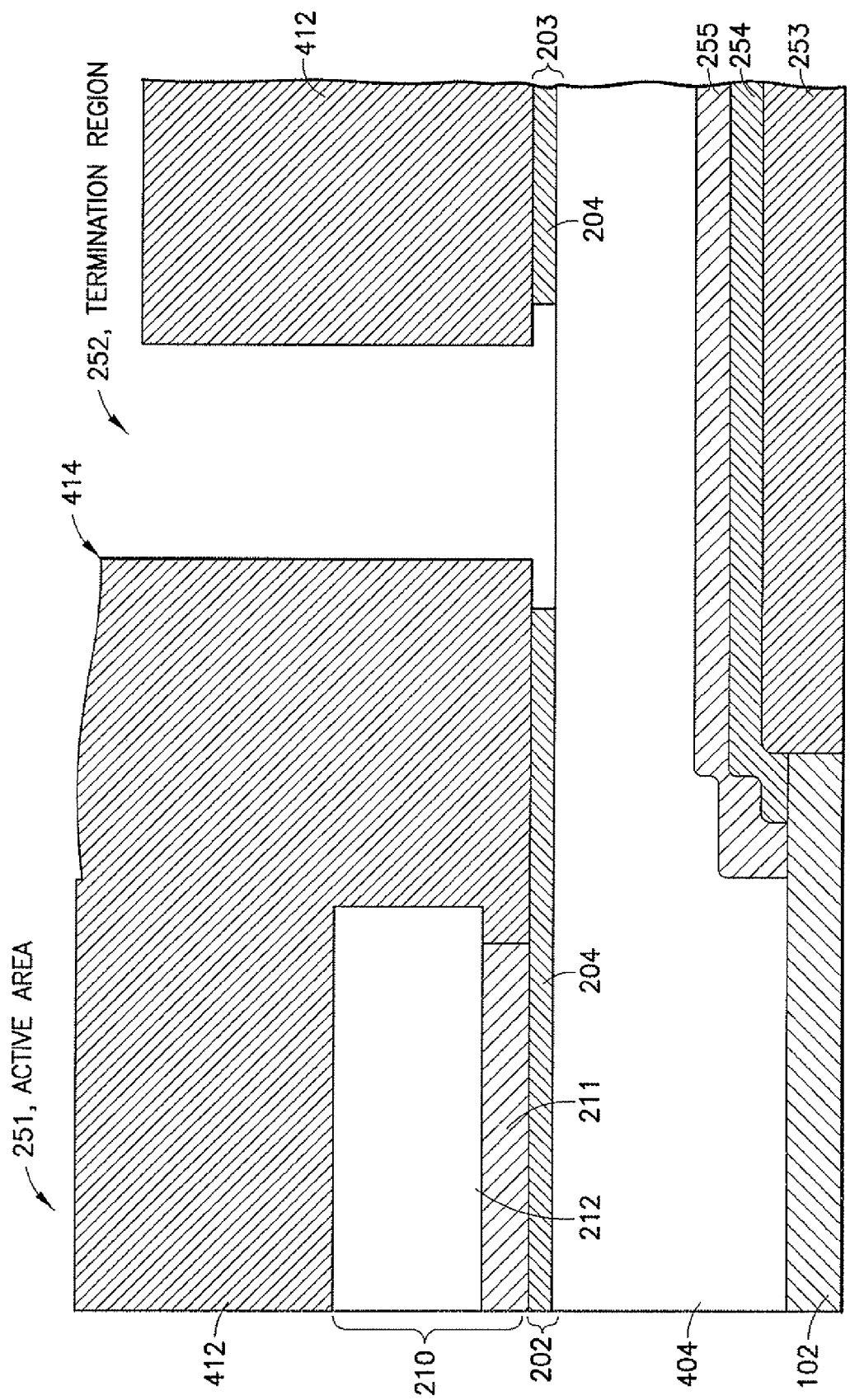

Referring to FIG. 13, photoresist layer 412 is next used as a mask to etch titanium layer 204 from the surface of contact metal layer 404, thereby forming barrier layer 202 and barrier layer 203. As an example, titanium layer 204 may be etched by immersing the device of FIG. 12 into a tank of hydrofluoric acid (HF) having a 100:1 concentration for about 50 seconds and thereafter rinsing the device.

Figure 14:
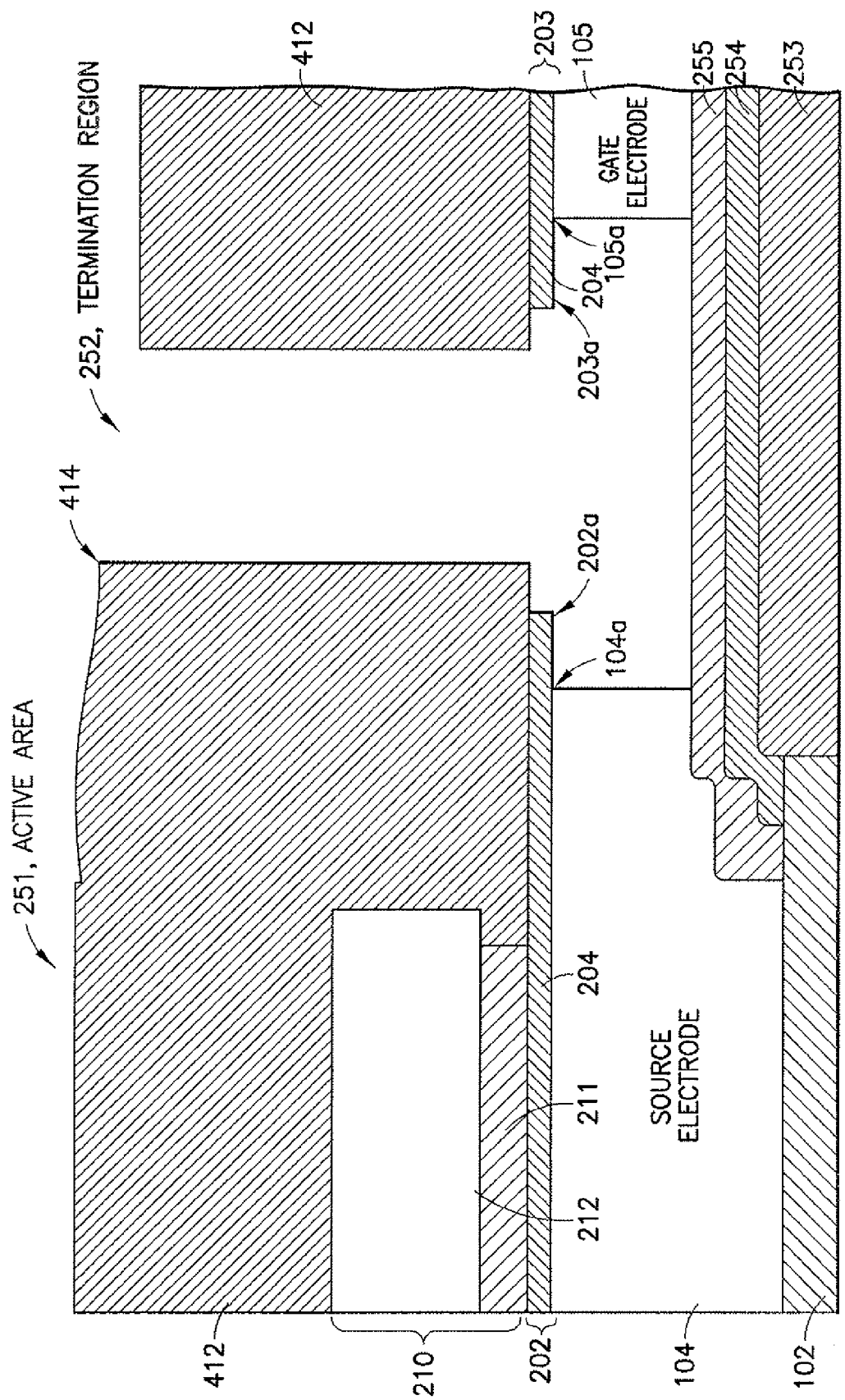

Referring next to FIG. 14, photoresist layer 412 is thereafter used as a mask to etch contact metal layer 404 from the surface of ILD layer 255, thereby forming source electrode 104 and gate electrode 105. As an example, contact metal layer 404 may be etched by immersing the device of FIG. 13 into a tank of PAN (a mixture of phosphoric, acetic and nitric acids) and thereafter rinsing the device.

As shown in FIG. 14, as a result of etching contact metal layer 404 to form the source and gate electrodes, the contact metal layer may be etched from the under side of the outer peripheral edges of barrier layers 202 and 203, thereby forming overhangs 202a and 203a. According to an embodiment of the invention, these overhangs may be left in place, thereby subsequently forming device 200a as shown in FIG. 5, for example. Alternatively, according to another embodiment of the invention, these overhangs may be further etched and possibly removed. For example, these overhangs may be etched such that the outer peripheral edges of barrier layers 202 and 203 extend up to the outer peripheral edges 104a and 105a of the source and gate electrodes. Alternatively, these overhangs may be removed such that the outer peripheral edges of the barrier layers are recessed back from the outer peripheral edges of the electrodes, subsequently forming device 200 as shown in FIG. 4, for example.

Figure 15:
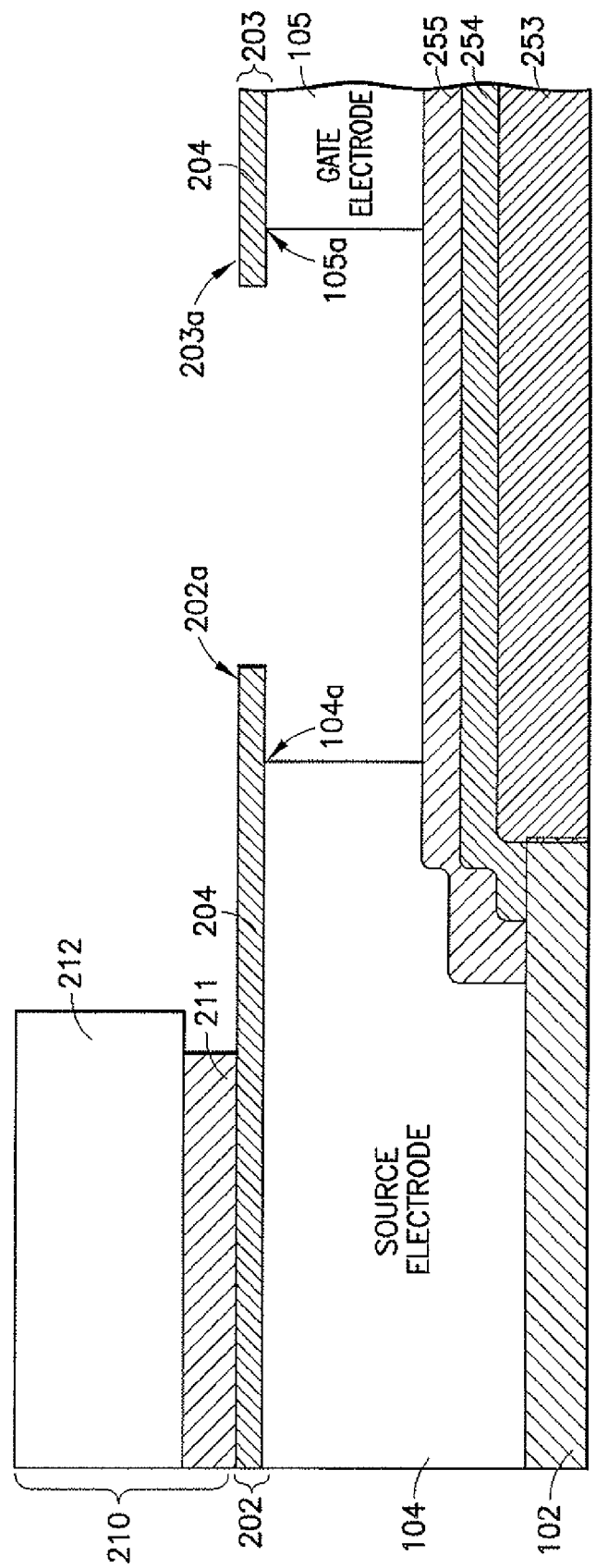
Figure 16:
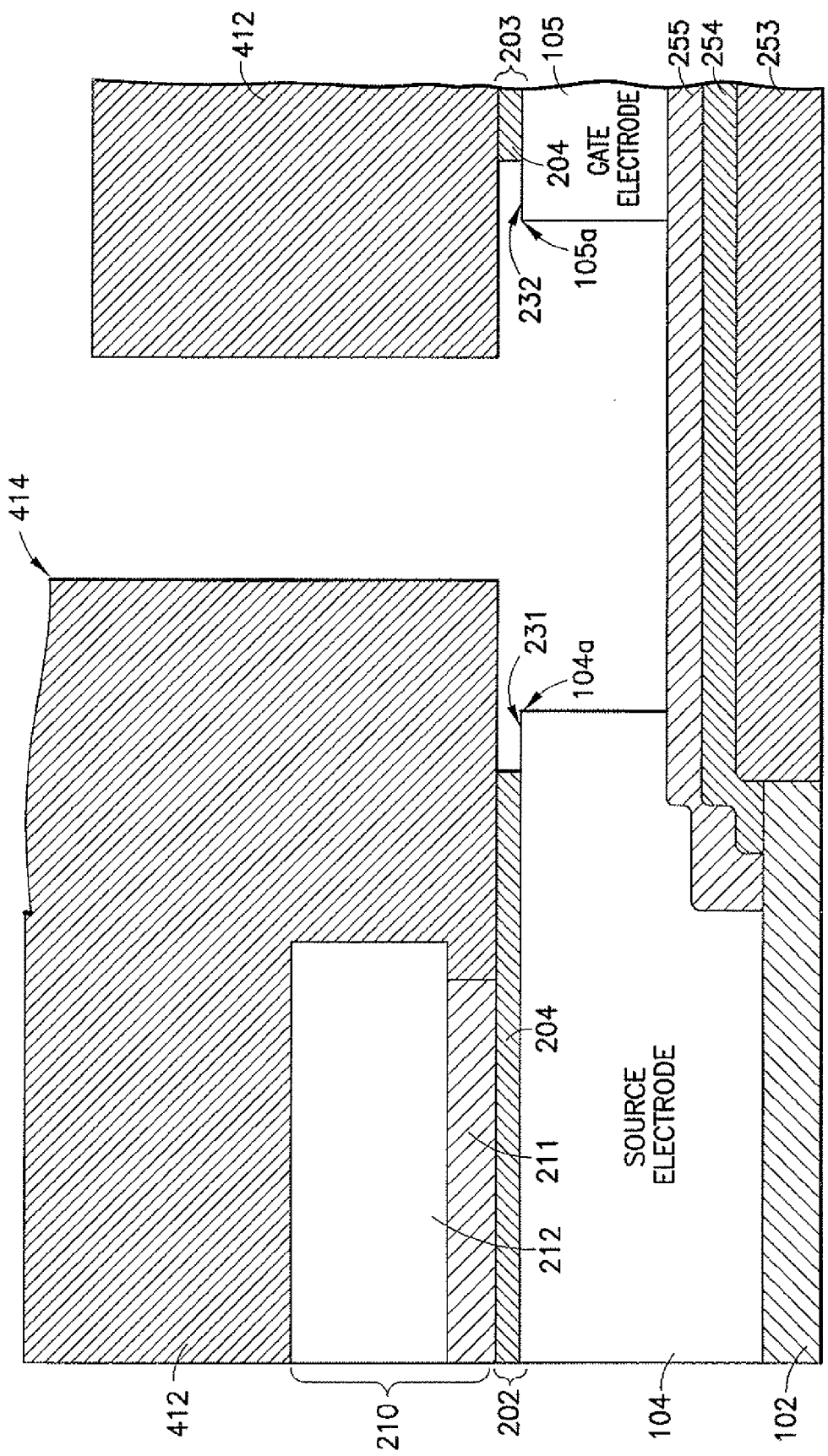

Assuming no further etching is performed, photoresist layer 412 is next removed, thereby resulting in a device as shown in FIG. 15 for example, with barrier layers 202 and 203 having overhangs 202a and 203a that extend beyond the outer peripheral edges 104a and 105a of the source and gate electrodes. Alternatively, assuming further etching of titanium layer 204 is to be performed, the device of FIG. 14 may be once again immersed into a tank of hydrofluoric acid and then rinsed. Assuming the outer peripheral edges of barrier layers 202 and 203 are to be recessed back from the outer peripheral edges 104a and 105a of the electrodes, the device of FIG. 14 may be immersed in the hydrofluoric acid for about 50 seconds. As a result of this additional etching, outer peripheral portions 231 and 232 along the top surfaces of the source and gate electrodes may be exposed, as shown in FIG. 16. Thereafter, photoresist layer 412 is removed resulting in a device as shown in FIG. 17, for example.

Figure 17:
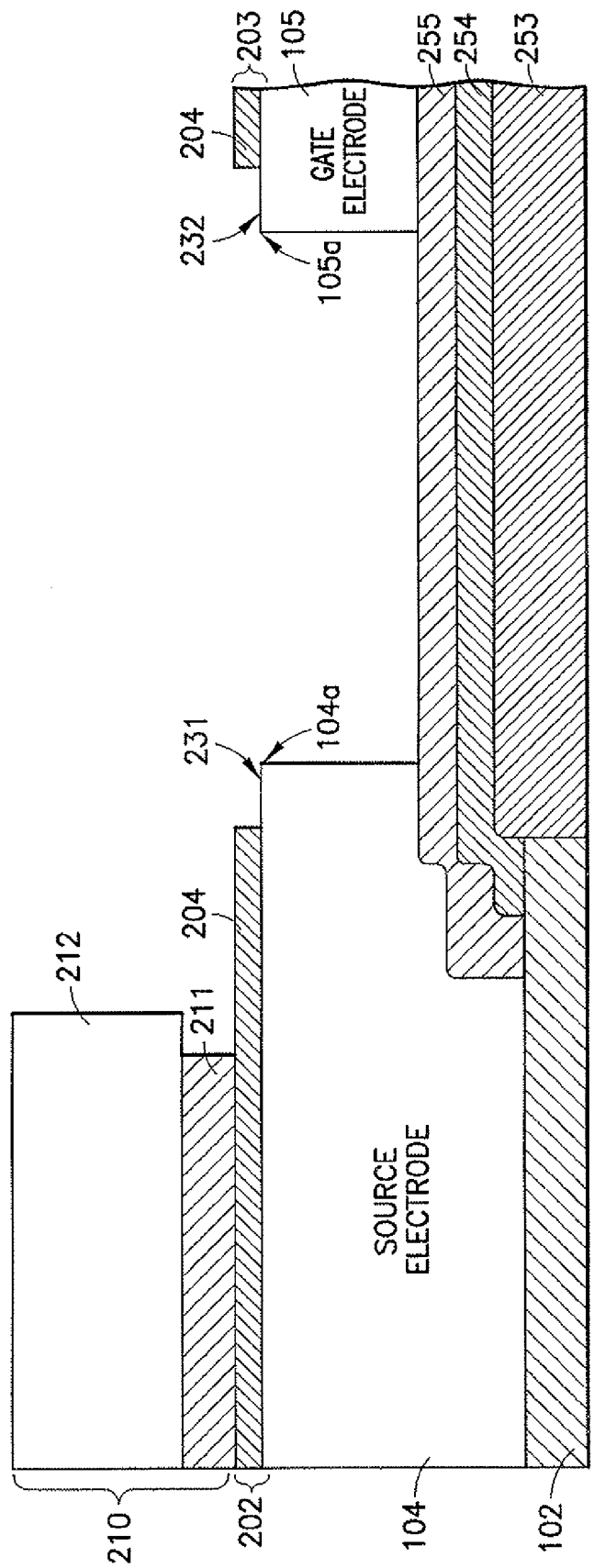

Once photoresist layer 412 is removed, a back metal contact made of aluminum for example, is then deposited over the bottom surface of the device shown in FIG. 15 or FIG. 17 for example, thereby forming drain electrode 103.

Next, passivation layer 220 with a thickness of about 18 um for example is formed over the top surface of the device shown in FIG. 15 or FIG. 17, covering the solderable contacts and barrier layers 202 and 203, and filling the region between the source and gate electrodes. Again, passivation layer 220 may be any suitable epoxy passivation that may be able to also act as a solder resist. Thereafter, using any suitable process, openings are formed in passivation layer 220 to remove the passivation layer from the top of each solderable contact, as shown for devices 200 and 200a of FIGS. 4 and 5, for example. As indicated above, these openings are preferably wider than the solderable contacts and preferably extend to barrier layers 202 and 203 there below, thereby forming a gap between each solderable contact and the surrounding passivation layer.

Finally, as partially shown by devices 200 and 200a of FIGS. 4 and 5, the device may be packaged as a DirectFET® type device package, electrically connecting drain electrode 103 to the web portion 113 of the package clip.

Referring now to FIGS. 18-23, there is shown an alternative example process according to an embodiment of the invention for manufacturing a semiconductor device, like device 200 as shown in FIG. 4, for example. In particular, it is noted that the above fabrication process may damage ILD layer 255 along termination region 252. The process shown in FIGS. 18-23 adds a barrier layer over the ILD layer to protect the ILD layer. Specifically, beginning with FIG. 18, die 102, including field oxide ring 253, field plate 254, and ILD layer 255 along termination region 252, are first formed as described above. Thereafter, a barrier layer 256 made of titanium for example, is deposited over the entire top and side surfaces of ILD layer 255.

The process then proceeds as similarly described above through the formation of the source and gate electrodes. Specifically, referring to FIG. 19, a contact metal layer 404 is next deposited over the top surface of die 102 and over the outer surfaces of barrier layer 256. Thereafter, titanium barrier layer 204 is deposited over the top surface of contact metal layer 404 and solderable top metal 406, including nickel layer 211 and silver layer 212 for example, is deposited over the top surface of the titanium layer.

Figure 20:
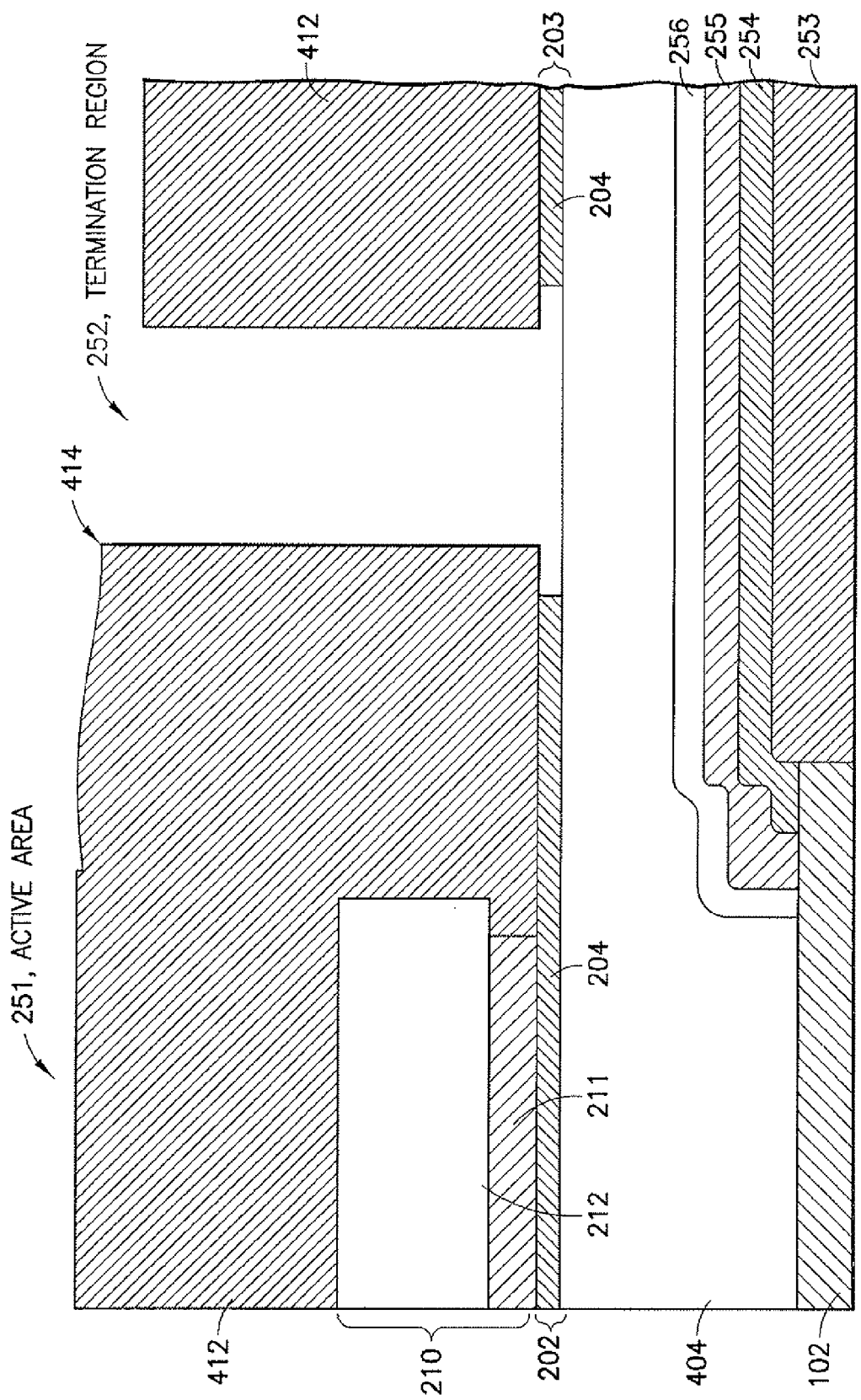

Referring next to FIG. 20, solderable top metal 406 is then masked and silver layer 212 and nickel layer 211 subsequently etched in order to form solderable contacts, such as solderable contact 210, atop titanium layer 204, as similarly described above. Thereafter, photoresist layer 412 with openings therein is formed over the surface of the resulting device, thereby forming a mask over the titanium barrier layer 204. Photoresist layer 412 is then used to etch titanium layer 204 along the termination region as described above to form barrier layers 202 and 203, resulting in the device of FIG. 20.

Figure 21:
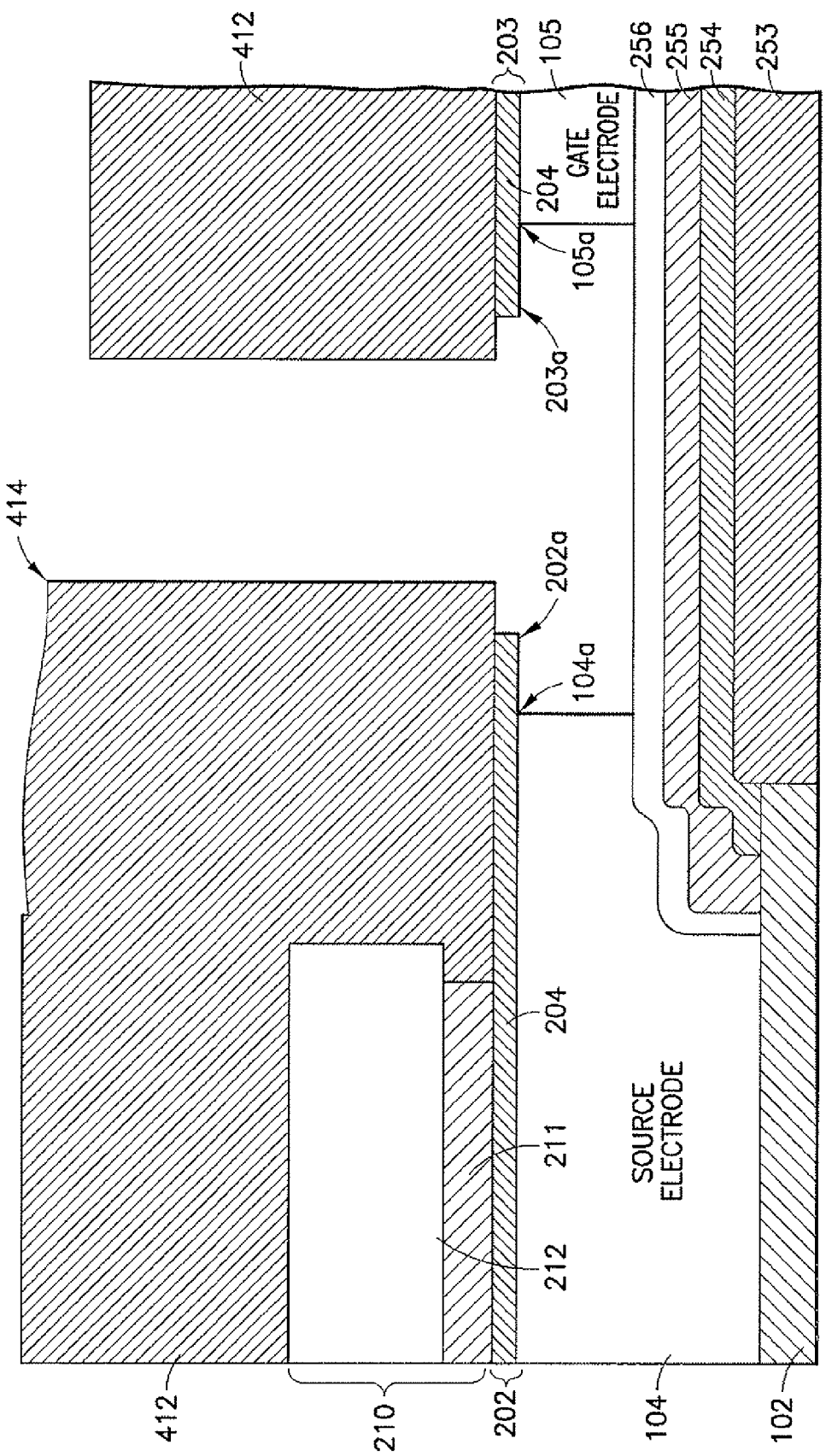
Figure 22:
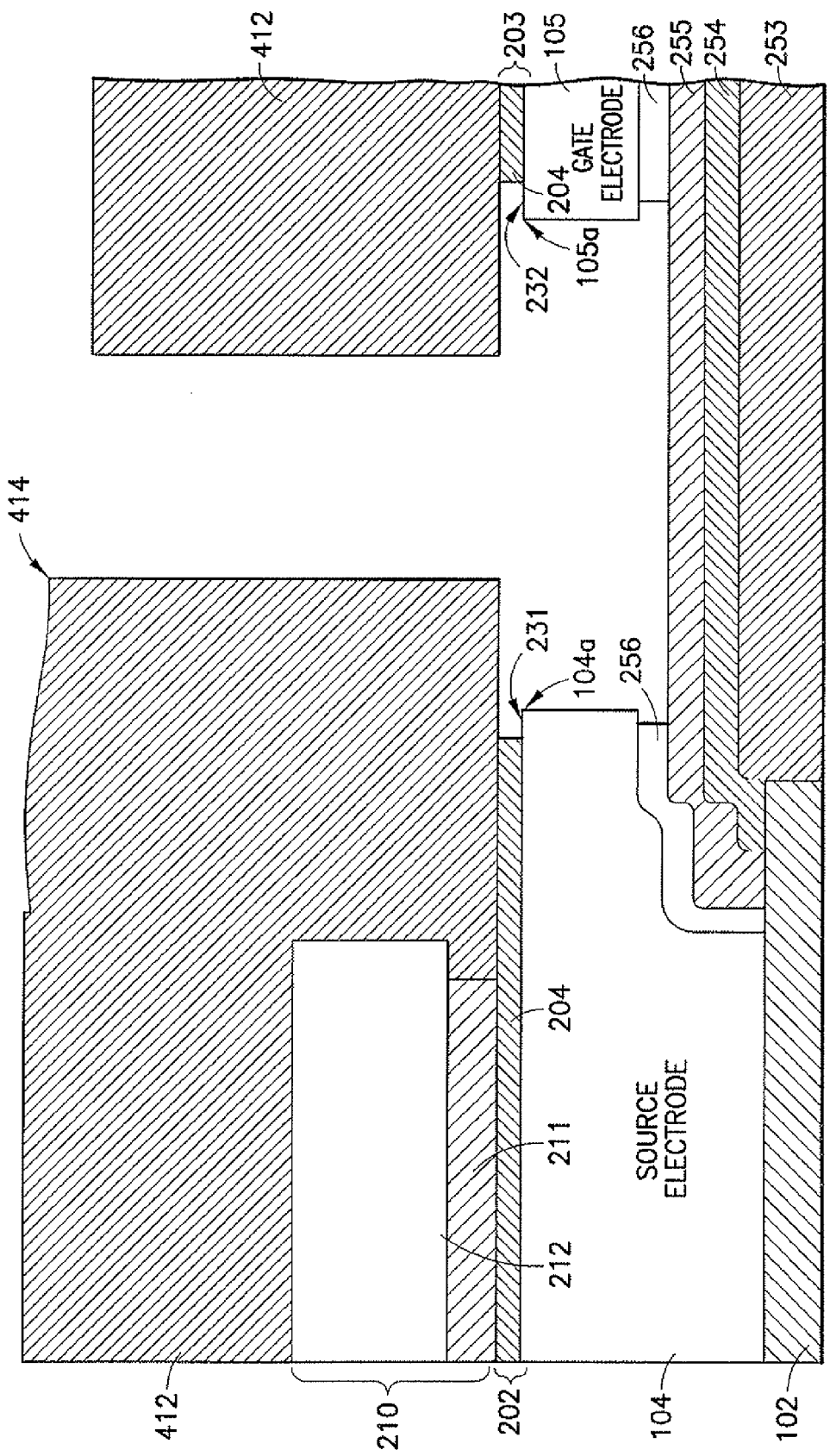

Referring to FIG. 21, photoresist layer 412 is next used as a mask to etch contact metal layer 404 down to the surface of barrier layer 256, thereby forming source electrode 104 and gate electrode 105. Again, contact metal layer 404 may be etched by immersing the device of FIG. 20 into a tank of PAN. As shown in FIG. 21 and as similarly described above, as a result of etching contact metal layer 404 to form the source and gate electrodes, the contact metal layer may be etched from the under side of the outer peripheral edges of barrier layers 202 and 203, thereby forming overhangs 202a and 203a that extend beyond the outer peripheral edges 104a and 105a of the source and gate electrodes.

As can be seen, according to this embodiment of the invention, barrier layer 256 over ILD layer 255 protects the ILD layer during the formation of the source and gate electrodes. Accordingly, once the electrodes are formed, barrier layer 256 must thereafter be etched to electrically separate the electrodes. As such, referring to FIG. 22, the device of FIG. 21 is next immersed into a tank of hydrofluoric acid (HF), for example, thereby etching barrier layer 256 and exposing a portion of the top surface of ILD layer 255. Note that as a result of etching barrier layer 256, barrier layers 202 and 203 are further etched and may be etched, for example, such that the outer peripheral edges of the barrier layers are recessed back from the outer peripheral edges 104a and 105a of the electrodes. As a result, outer peripheral portions 231 and 232 along the top surfaces of the source and gate electrodes may be exposed, thereby subsequently forming a device similar to device 200 of FIG. 4, for example.

Figure 23:
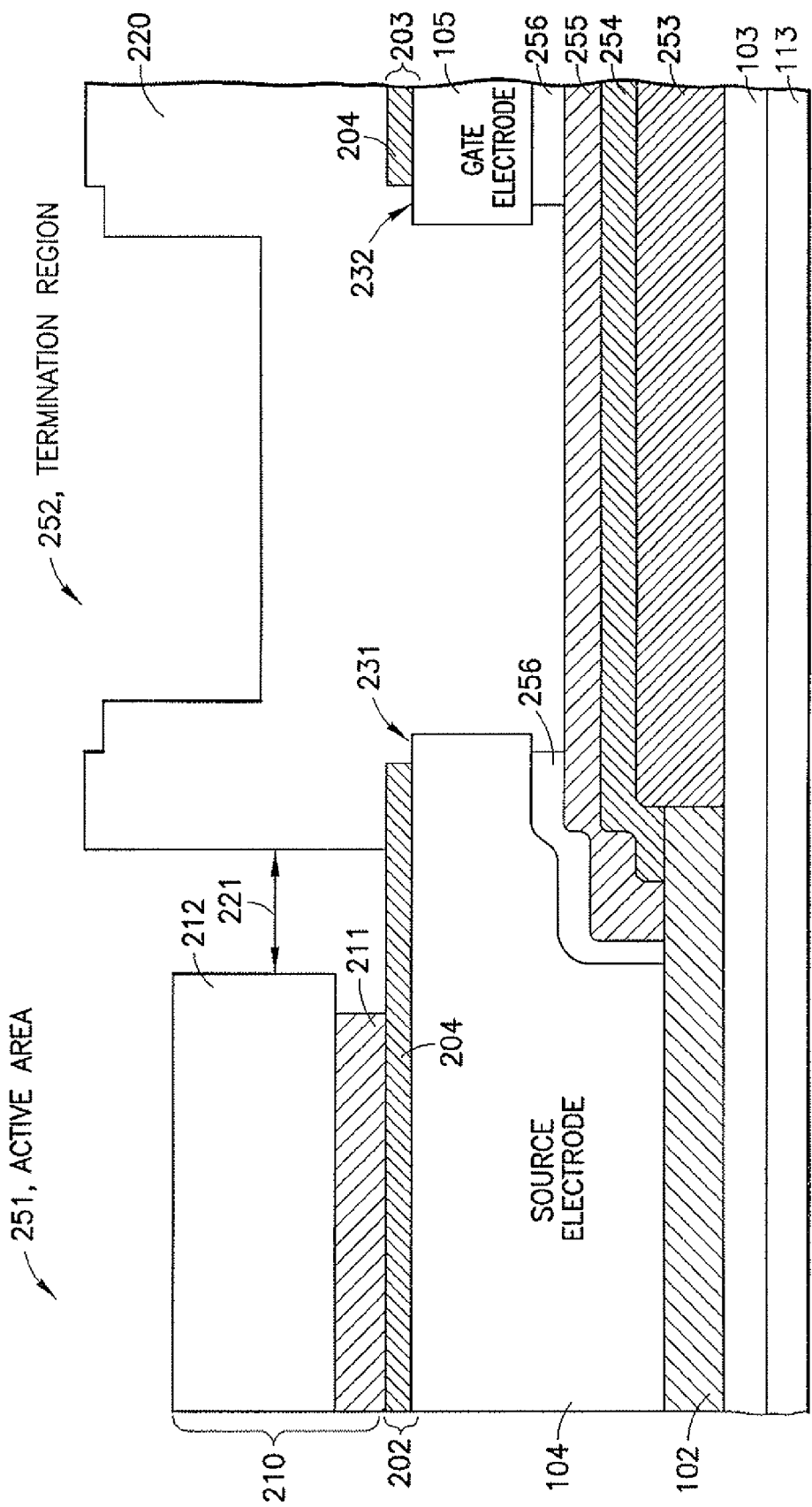

Thereafter, the fabrication of the device may proceed as similarly described above for device 200, thereby resulting in a device like that shown in FIG. 23, for example. In particular, photoresist layer 412 may next be removed, drain electrode 103 then formed, passivation layer 220 thereafter deposited, and openings then formed within the passivation layer over the solderable contacts. Note that the device of FIG. 23 is similar to device 200 for example, except for the addition of the remaining barrier layer 256.

Figure 24:
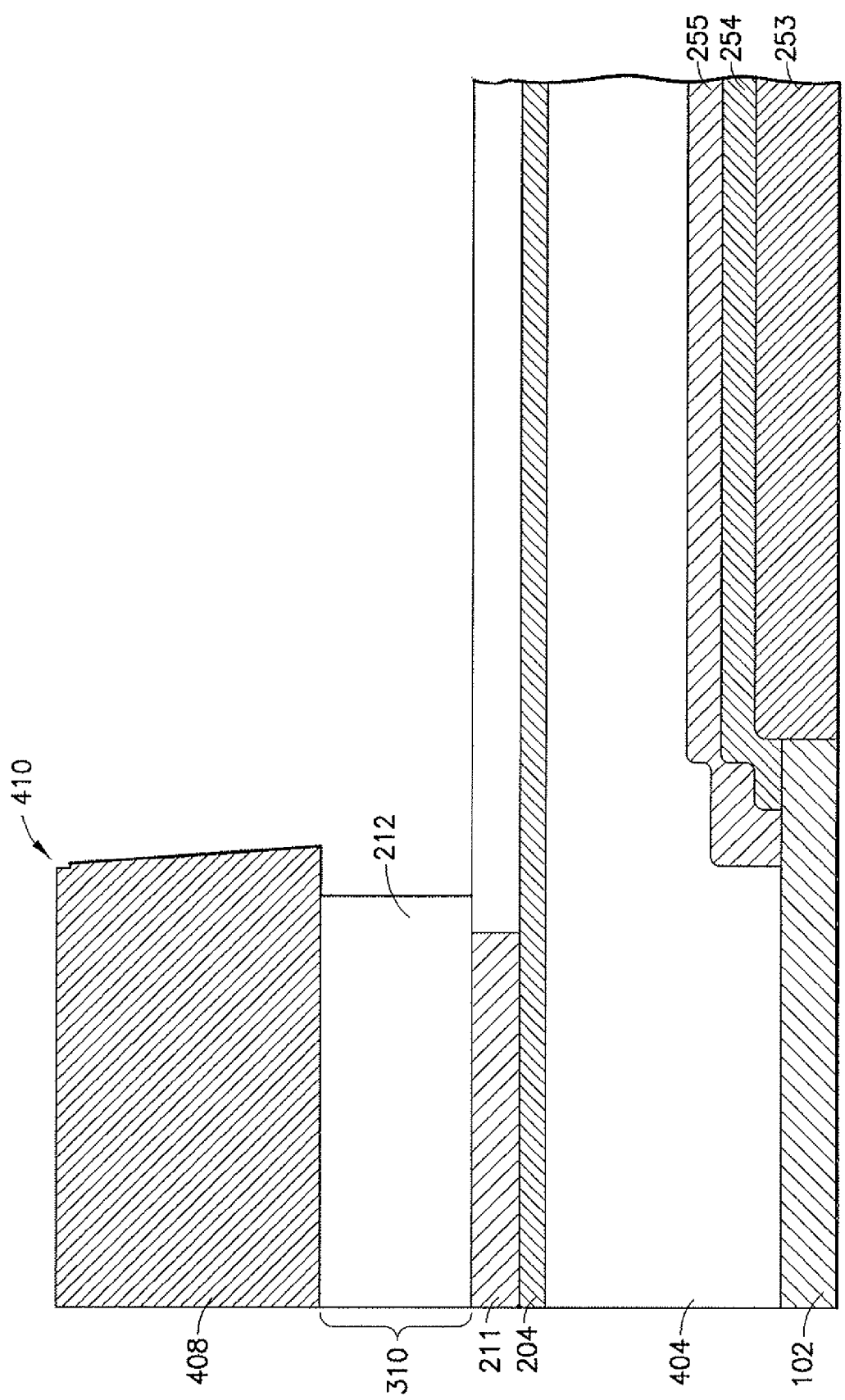
FIGS. 24-27 illustrate a portion of an example process according to an embodiment of the invention for fabricating the semiconductor device of FIG. 6.

Referring now to FIGS. 24-27, there is shown a partial example process according to an embodiment of the invention for manufacturing semiconductor device 300 as shown in FIG. 6 for example, which device has a barrier layer that includes both a titanium layer and nickel layer as described above. The fabrication of device 300 proceeds as similarly shown in FIGS. 8 through 10, for example. Thereafter and as shown in FIG. 24, photoresist layer 408 is used as a mask to etch silver layer 212 from the top surface of nickel layer 211, thereby forming solderable contacts, such as contact 310, for the source and gate electrodes. Again, silver layer 212 may be etched by immersing the device of FIG. 10 into a tank containing a mixture of ammonium hydroxide and hydrogen peroxide.

Figure 25:
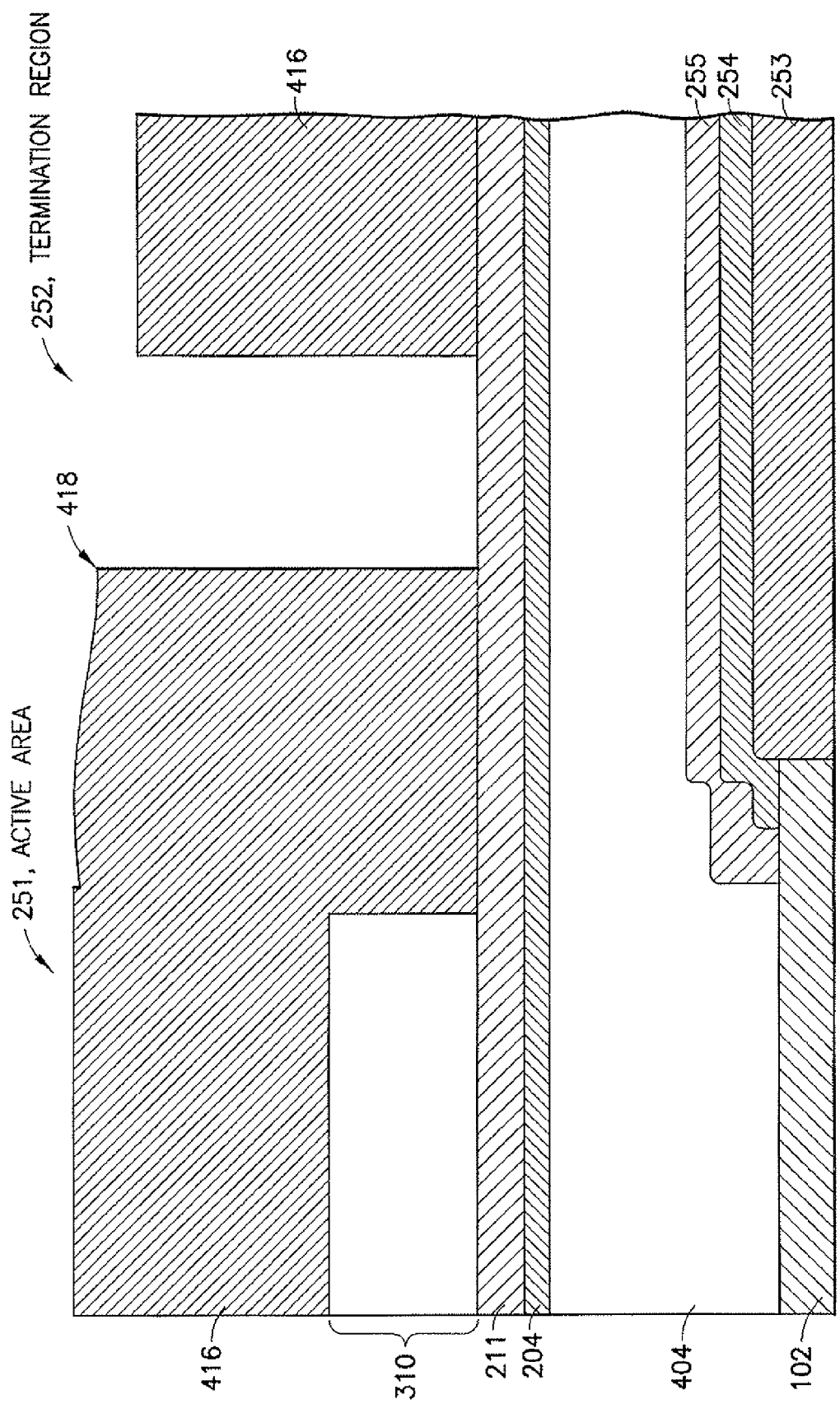

Referring to FIG. 25, photoresist layer 408 may next be removed from the surfaces of the resulting solderable contacts and a second suitable photoresist layer 416 then formed over the solderable contacts and atop the exposed surface of nickel layer 211. Alternatively, photoresist layer 408 may be left in place and photoresist layer 416 formed along the exposed surface of nickel layer 211, for example. As similarly described above, photoresist layer 416 is used as a mask to form source electrode 104 and gate electrode 105 and is also used to form barrier layers 302 and 303 atop these electrodes.

Accordingly and as shown in FIG. 25, once patterning photoresist layer 416, a plurality of openings, such as opening 418, are then formed within the photoresist layer along the termination region, thereby exposing a portion of the top surface of nickel layer 211.

Figure 26:
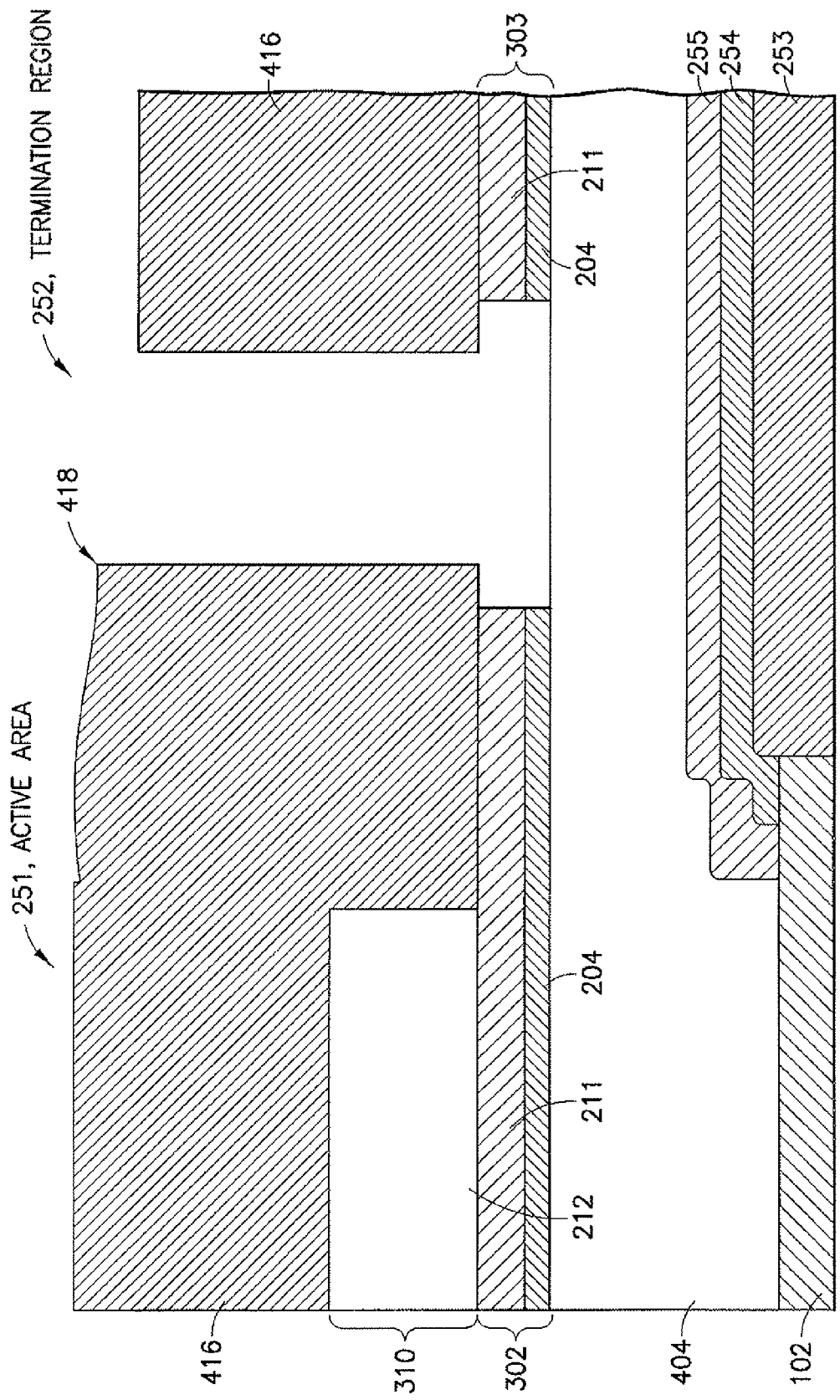

Referring to FIG. 26, photoresist layer 416 is next used as a mask to etch nickel layer 211 and titanium layer 204 from the surface of contact metal layer 404, thereby forming barrier layer 302 and barrier layer 303. Again, nickel layer 211 may be etched by immersing the device into a tank of nitric acid and titanium layer 204 may be etched by immersing the device into a tank of hydrofluoric acid.

Figure 27:
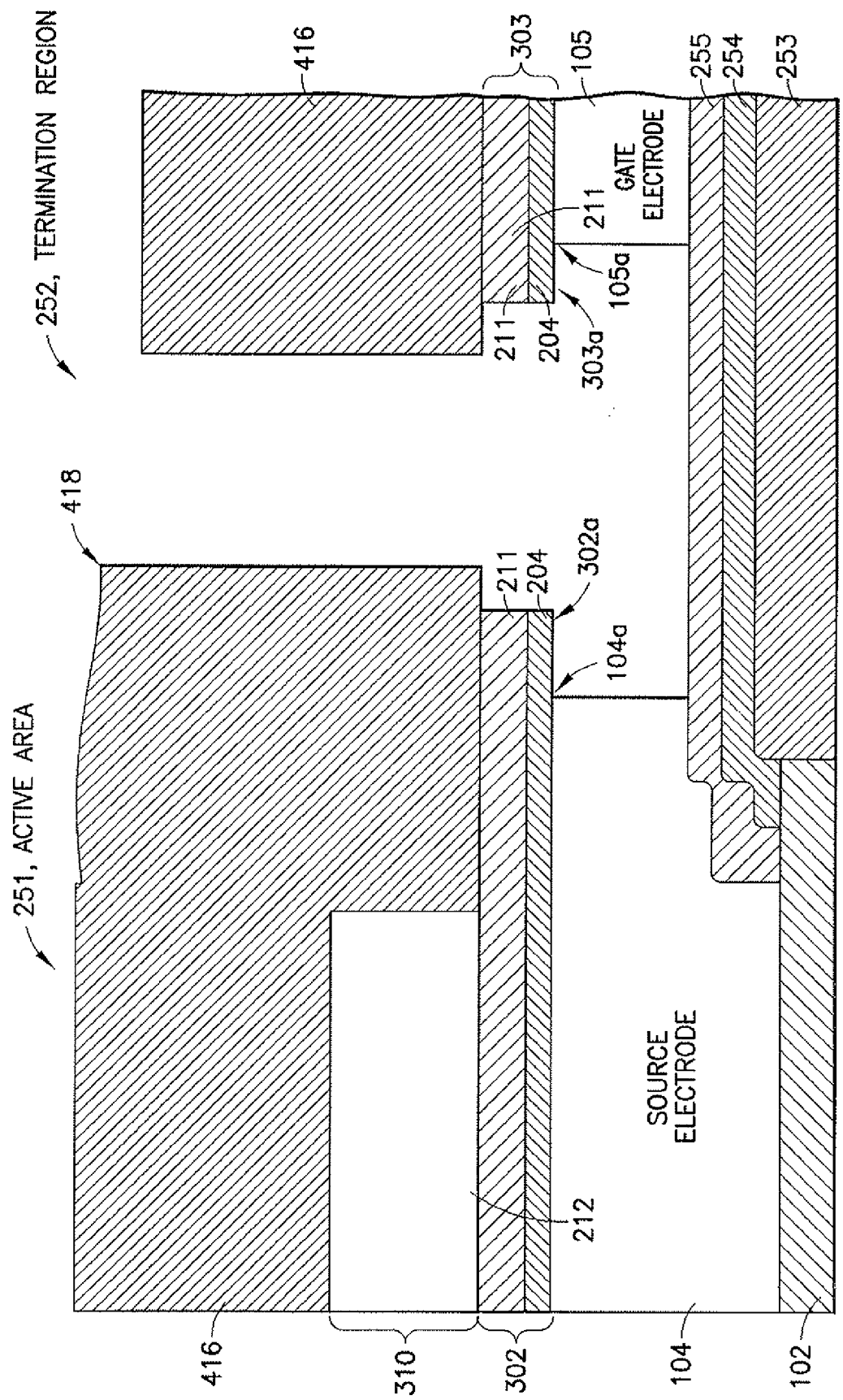

Referring to FIG. 27, photoresist layer 416 is next used as a mask to etch contact metal layer 404 from the surface of ILD layer 255, thereby forming source electrode 104 and gate electrode 105. As shown in FIG. 27, as a result of etching contact metal layer 404 to form the source and gate electrodes, the metal layer may be etched from the under side of the outer peripheral edges of barrier layers 302 and 303, thereby forming overhangs 302a and 303a. As similarly described for devices 200 and 200a, these overhangs may be left in place, thereby subsequently forming a device 300 as shown in FIG. 6, for example. Alternatively, these overhangs may be further etched and possibly removed by further etching titanium layer 204 and nickel layer 211, as similarly described above.

Whether or not the overhangs 302a and 303a are further etched, the fabrication of device 300 thereafter proceeds as similarly described above for devices 200/200a, for example. In particular, photoresist layer 416 may next be removed, drain electrode 103 then formed, passivation layer 220 thereafter deposited, and openings then formed within the passivation layer over the solderable contacts, thereby forming device 300 of FIG. 6, for example.

According to another embodiment of the invention, the example process shown in FIGS. 24-27 may be modified to include a barrier layer 256 over ILD layer 255, as similarly described above, in order to protect the ILD layer.

Referring now to FIGS. 28-34, there is shown an example process according to an embodiment of the invention for manufacturing semiconductor device 400 as shown in FIG. 7, for example. Beginning with FIG. 28, die 102, including field oxide ring 253, field plate 254, and ILD layer 255 along termination region 252, are first formed as described above. Thereafter, a contact metal layer 404 is deposited over the top surface of die 102 along both the active area 251 and termination region 252.

Referring next to FIG. 29, a suitable photoresist layer 420 is then formed atop contact metal layer 404, this photoresist layer being used as a mask to form source electrode 104 and gate electrode 105. Accordingly, photoresist layer 420 is next patterned by an appropriate photolithographic mask step based on the desired pattern of the electrodes and a plurality of openings, such as opening 422, are then formed therein along the termination region, thereby exposing a portion of the top surface of contact metal layer 404. Photoresist layer 420 is then used as a mask to etch contact metal layer 404 down to the top surface of ILD layer 255, thereby forming source electrode 104 and gate electrode 105, as shown in FIG. 29. Again, contact metal layer 404 may be etched by immersing the device into a tank of peroxynitrite. Thereafter, photoresist layer 420 is removed.

Figure 30:
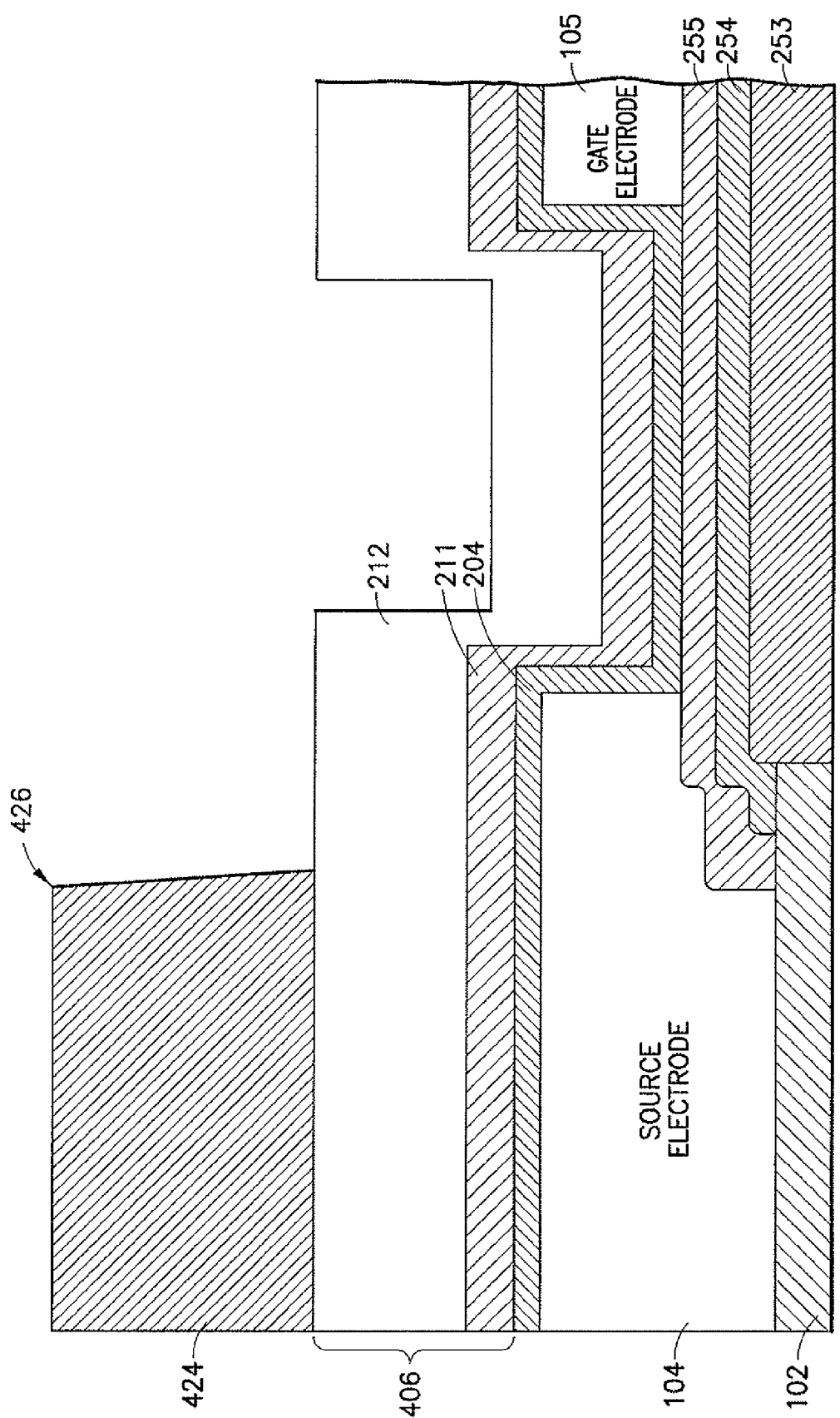

Referring to FIG. 30, a barrier layer is next deposited over the entire top and side surfaces of source electrode 104 and gate electrode 105 and along the exposed top surface of ILD layer 255. According to this embodiment of the invention, the barrier layer may be a titanium layer 204 deposited to a thickness of about 1800 Å, for example. Thereafter, a solderable top metal 406 is deposited over the top surface of titanium layer 204. Again, this solderable top metal may be a silver-containing metal stack, such as nickel layer 211 and silver layer 212, each deposited to a thickness of about 2000 Å and 6000 Å, respectively. Thereafter, a suitable photoresist layer 424 is formed over solderable top metal 406, this photoresist layer being used as a mask to form the solderable contacts atop source electrode 104 and gate electrode 105. Accordingly, photoresist layer 424 is next patterned by an appropriate photolithographic mask step based on the desired number and pattern of solderable contacts and a plurality of openings, such as opening 426, are then formed therein, thereby exposing a portion of the top surface of solderable top metal 406, as shown in FIG. 30.

Figure 31:
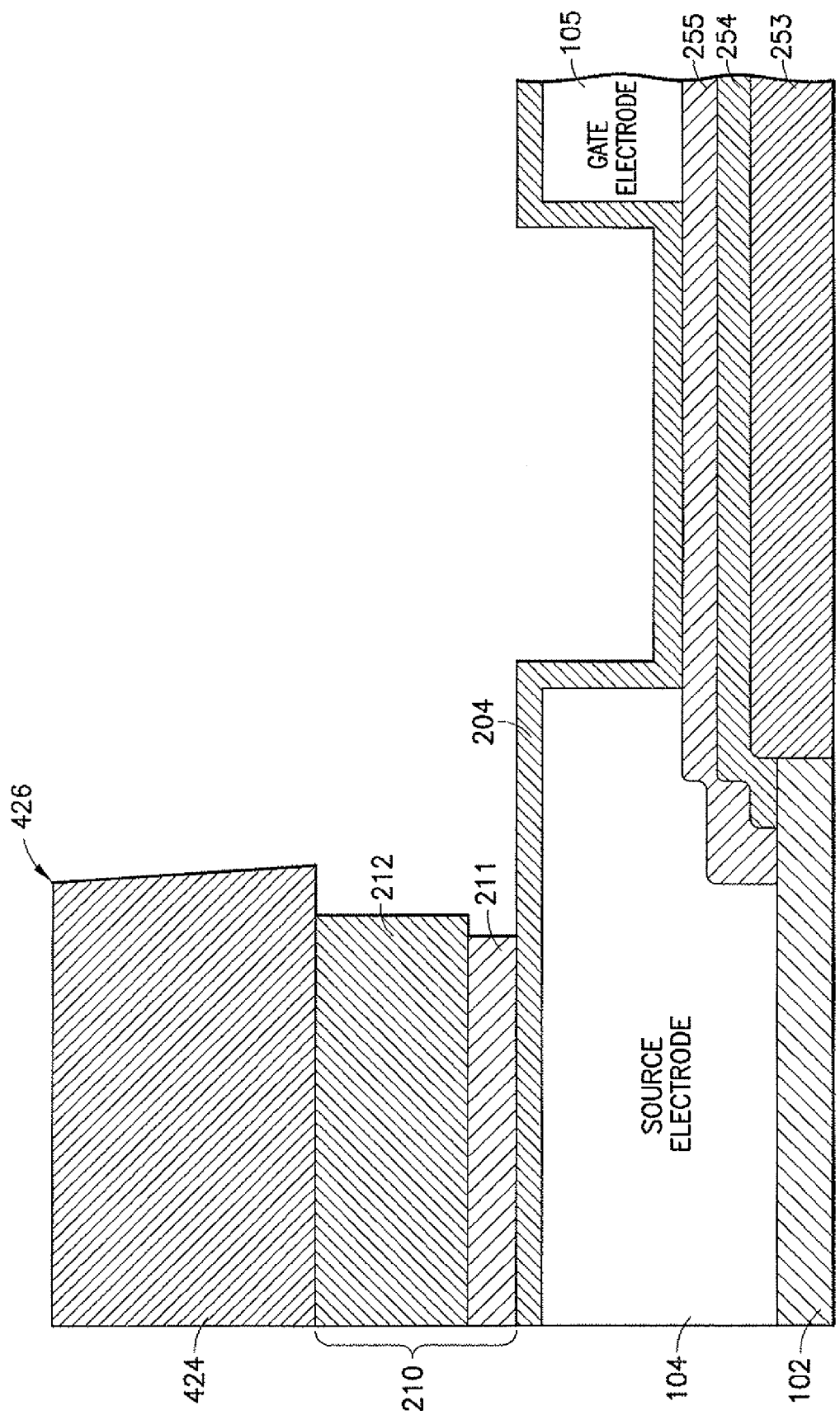

Referring to FIG. 31, photoresist layer 424 is then used as a mask to etch silver layer 212 and nickel layer 211 from the top surface of titanium layer 204, thereby forming solderable contacts, such as contact 210, for the source and gate electrodes. Again, silver layer 212 and nickel layer 211 may be etched by first immersing the device of FIG. 30 into a tank containing a mixture of ammonium hydroxide and hydrogen peroxide, and thereafter immersing the device into a tank of nitric acid.

Figure 32:
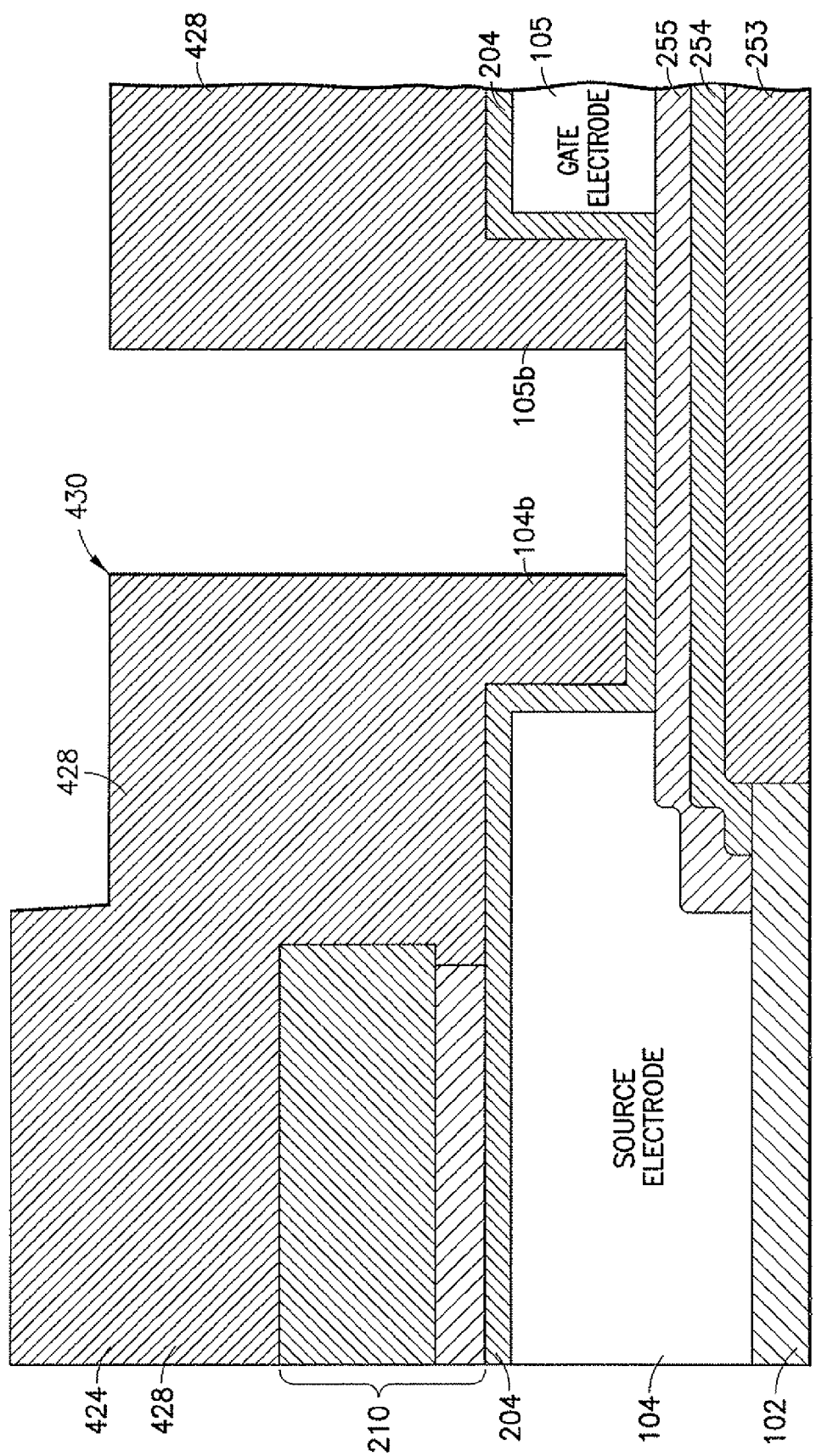

Referring next to FIG. 32, photoresist layer 424 is left in place and a second suitable photoresist layer 428 is formed over the exposed surface of titanium layer 204. Alternatively, photoresist layer 424 may be removed and photoresist layer 428 formed over both the solderable contacts and atop the exposed surface of the titanium layer. According to this embodiment of the invention, photoresist layer 424/428 is used as a mask to form barrier layers 402 and 403. As described above, these barrier layers extend over the entire top surfaces of source electrode 104 and gate electrode 105 and also along the vertical sidewalls 104b and 105b that surround the outer peripheral edges of these electrodes. Accordingly, photoresist layer 424/428 is next patterned by an appropriate photolithographic mask step and a plurality of openings, such as opening 430, are then formed therein such that the openings only expose a portion of the top surface of titanium layer 204 along ILD layer 255, as shown in FIG. 32.

Figure 33:
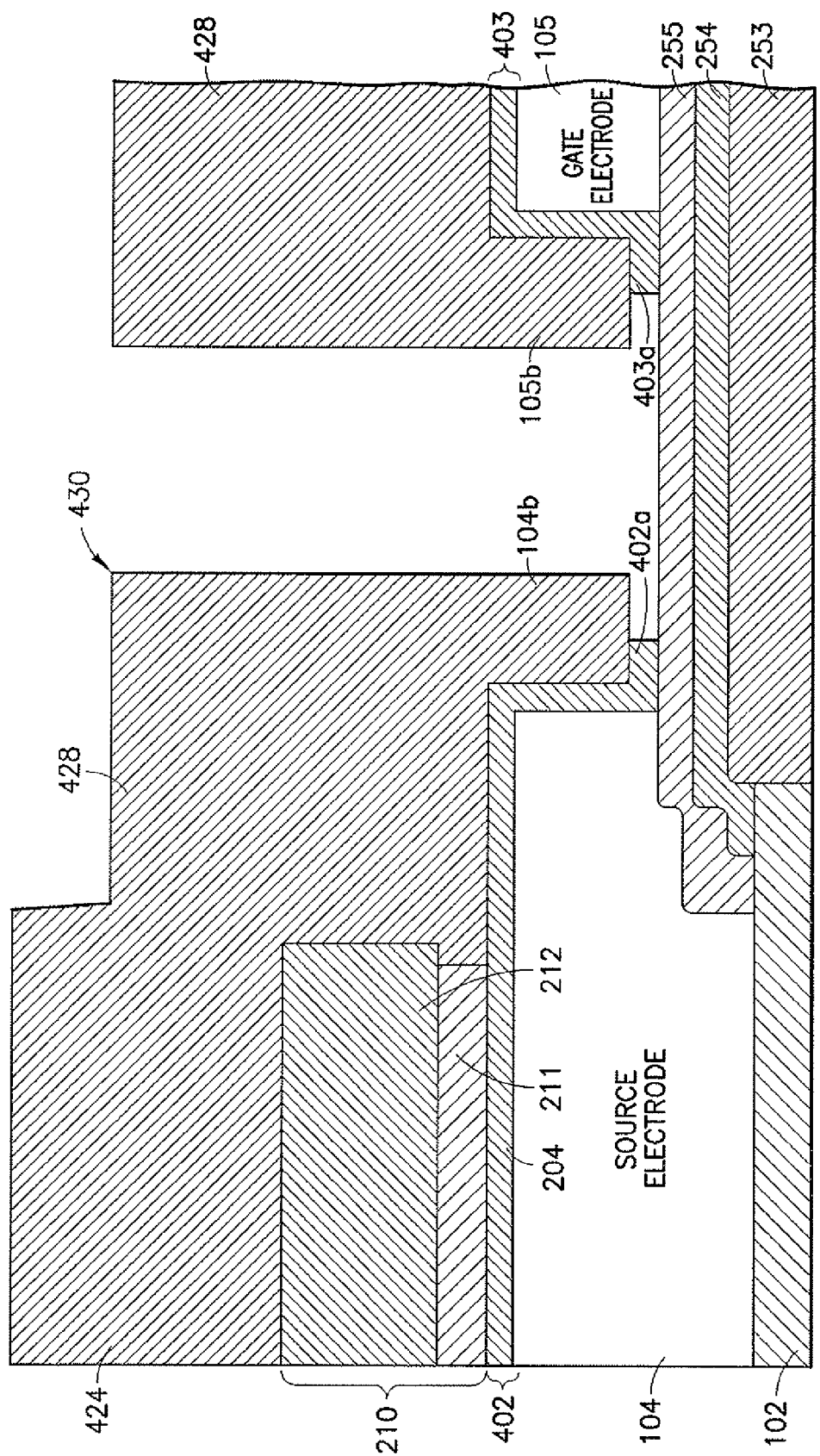
Figure 34:
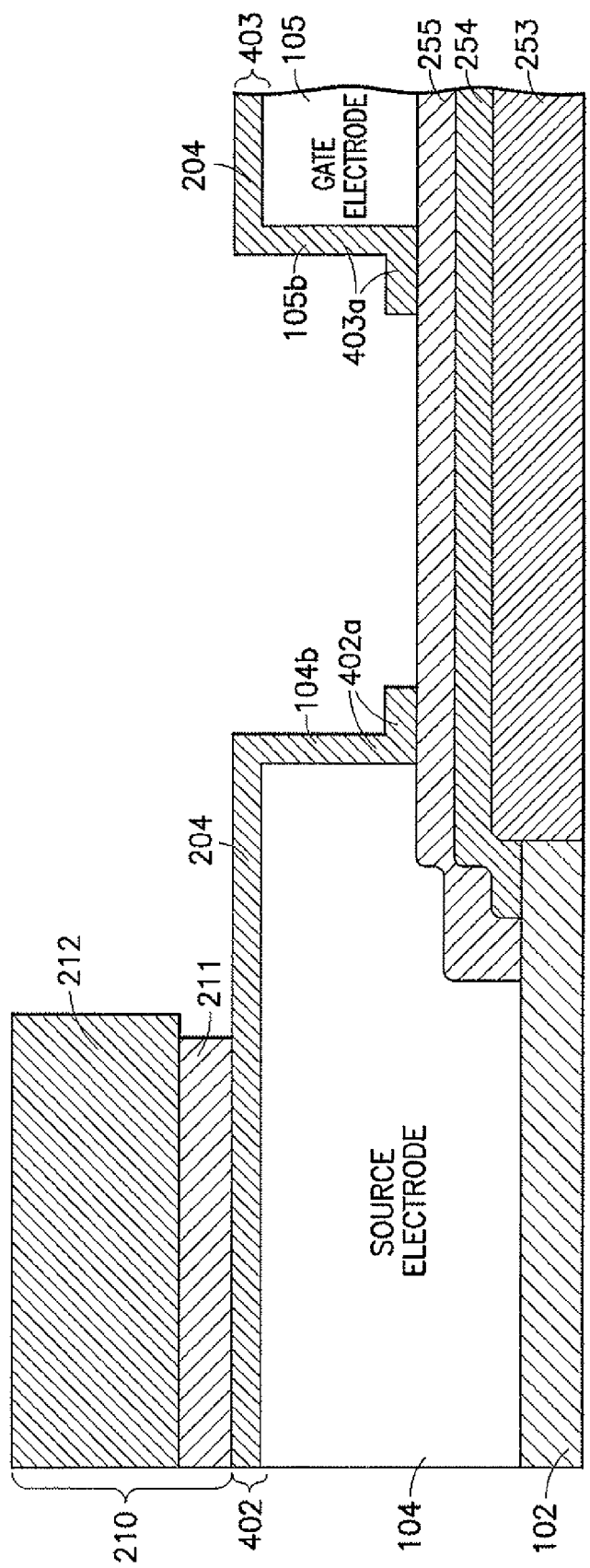

Referring to FIG. 33, photoresist layer 424/428 is next used as a mask to etch titanium layer 204 from the surface of ILD layer 255, thereby forming barrier layer 402 and barrier layer 403. Again, titanium layer 204 may be etched by immersing the device of FIG. 32 into a tank of hydrofluoric acid. Thereafter, photoresist layer 424/428 is removed, thereby resulting in a device as shown in FIG. 34, for example. As shown in FIGS. 33 and 34, barrier layers 402 and 403 extend across the entire top surfaces of the source and gate electrodes and also include extensions 402a and 403a that extend along the vertical sidewalls 104b and 105b of these electrodes. Again, extensions 402a and 403a may also extend along ILD layer 255, as shown in the Figures.

Thereafter, the fabrication of device 400 proceeds as similarly described above for devices 200/200a, for example. In particular, drain electrode 103 is then formed along the bottom surface of die 102, passivation layer 220 is thereafter deposited over the top surface of the die, and openings are then formed within the passivation layer over the solderable contacts, thereby forming device 400 of FIG. 7, for example.

One skilled in the art will recognize that the example process shown in FIGS. 28-34 may also be modified similar to the example process shown in FIGS. 24-27 such that barrier layers 402 and 403 include both a layer of titanium and a layer of nickel. Similarly, one skilled in the art will also recognize that the example process shown in FIGS. 28-34 may also be modified to include a barrier layer 256 over ILD layer 255, as similarly described above, in order to protect the ILD layer.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a semiconductor die having a first major surface;
   an electrode on said first major surface of said die;
   a solderable contact disposed over a top surface of said electrode;
   a passivation layer formed over said electrode and including an opening wider than said solderable contact to form an empty gap that surrounds said solderable contact, said gap being formed between confronting edges of said solderable contact and said surrounding passivation layer; and
   a barrier layer on the top surface of said electrode, said barrier layer being disposed between said solderable contact and said electrode and extending across said gap and under said passivation layer;
   wherein said solderable contact is received inside said opening in said passivation layer.

2. The semiconductor device of claim 1, wherein said barrier layer covers the top surface of said electrode.

3. The semiconductor device of claim 1, wherein said barrier layer comprises a material that protects said electrode and said semiconductor die from attack by acidic fluxes.

4. The semiconductor device of claim 1, wherein said barrier layer comprises a conductive material.

5. The semiconductor device of claim 1, wherein said barrier layer comprises titanium.

6. The semiconductor device of claim 1, wherein said barrier layer comprises a titanium layer on the top surface of said electrode and a nickel layer disposed over said titanium layer.

7. The semiconductor device of claim 1, wherein said solderable contact comprises silver.

8. The semiconductor device of claim 1, wherein said die is a power switching device.

9. A protected barrier semiconductor device for use with a semiconductor die, said semiconductor die comprising an electrode and a solderable contact disposed over said electrode, said protected barrier semiconductor device comprising:
   a passivation layer formed over said electrode, said passivation layer including an opening to form an empty gap between said solderable contact and said passivation layer;
   a barrier layer formed over said electrode, said barrier layer extending across said gap;
   wherein said solderable contact is received inside said opening.

10. The protected barrier semiconductor device of claim 9, wherein said barrier layer is configured to prevent an acidic flux from contacting said electrode and said semiconductor die.

11. The protected barrier semiconductor device of claim 9, wherein said barrier layer comprises titanium.

12. The protected barrier semiconductor device of claim 9, wherein:
   said barrier layer comprises a first layer substantially comprising titanium, and a second layer substantially comprising nickel;
   said second layer is disposed over said first layer.

13. The protected barrier semiconductor device of claim 9, wherein said solderable contact substantially comprises silver.

* * * * *